United States Patent [19]

Audett et al.

[11] Patent Number: 5,587,261
[45] Date of Patent: Dec. 24, 1996

[54] UV/EB CURABLE BUTYL COPOLYMERS FOR LITHOGRAPHIC AND CORROSION-RESISTANT COATING

[75] Inventors: Jay D. Audett, Brown Deer, Wis.; Kenneth O. McElrath, Waterloo, Belgium

[73] Assignee: Exxon Chemical Patents Inc., Wilmington, Del.

[21] Appl. No.: 473,858

[22] Filed: Jun. 7, 1995

Related U.S. Application Data

[62] Division of Ser. No. 298,450, Oct. 27, 1994, which is a division of Ser. No. 982,104, Nov. 24, 1992, Pat. No. 5,376,503, which is a continuation of Ser. No. 631,610, Dec. 20, 1990.

[51] Int. Cl.$^6$ .............................. G03C 3/00; G03F 7/00; B41N 1/00; B41N 6/00
[52] U.S. Cl. .................. 430/18; 430/300; 101/401.1; 101/395
[58] Field of Search .................. 430/286.1, 287.1, 430/18, 270.1, 296, 300, 323, 325, 329, 195, 190, 175, 905, 913, 915, 916, 281.1; 522/35, 48, 53, 57, 160, 904, 905; 101/395, 401.1

[56] References Cited

U.S. PATENT DOCUMENTS

| | | | |
|---|---|---|---|
| 1,982,967 | 12/1934 | Sites | 430/307 |
| 3,002,003 | 9/1961 | Merrill et al. | 430/300 X |
| 3,096,311 | 7/1963 | Merrill et al. | 430/300 X |
| 3,100,702 | 8/1963 | Rauner et al. | 430/195 |
| 4,839,261 | 6/1989 | Nakazaki et al. | 430/313 |

*Primary Examiner*—George F. Lesmes
*Assistant Examiner*—Bernard P. Codd
*Attorney, Agent, or Firm*—Frank E. Reid; Myron B. Kurtzman; John E. Schneider

[57] ABSTRACT

A lithographic coating and method of framing a lithographic image are disclosed. The method comprises coating at least a portion of a surface of an article with a radiation-crosslinkable polymer, and exposing the coated surface to a pattern of radiation to crosslink the polymer in a lithographic image. The functionalized polymer is a copolymer of an isoolefin of 4 to 7 carbon atoms and para-alkylstyrene, wherein the para-alkylstyrene is functionalized with a radiation reactive group at the para-alkyl group of the para-alkylstyrene.

1 Claim, No Drawings

UV/EB CURABLE BUTYL COPOLYMERS FOR LITHOGRAPHIC AND CORROSION-RESISTANT COATING

This is a divisional of application Ser. No. 08/298,450, filed on Oct. 27, 1994 which is a divisional application of Ser. No. 07/982,104 filed Nov. 24, 1992, now U.S. Pat. No. 5,376,503, which is a continuation application of Ser. No. 07/631,610 filed on Dec. 20, 1990.

FIELD OF THE INVENTION

This invention relates to ultraviolet (UV) and electron beam (EB) reactive functionalized copolymers of isoolefin and para-alkylstyrene formulated into lithographic, corrosion resistant and other coatings. More particularly, this invention relates to such copolymers, coatings and methods wherein the para-alkylstyrene is functionalized to impart radiation curability.

BACKGROUND OF THE INVENTION

The use of radiation-sensitive functionality to induce crosslinking of a polymeric material is an advancing art, especially in the photographic industry where photographic films are composed of polymers having light sensitivity. However, it is also desirable to incorporate EB- or UV-crosslinkable functionality into elastomeric polymers. Elastomers containing such functionality could be utilized in pressure-sensitive adhesives (PSA's) and coatings to impart radiation curability, adhesive strength, and enhanced resistance to temperature, abrasion, solvents and ozone.

Applications employing external crosslinking reagents have certain inherent difficulties: such compositions require processing of the polymer with photoinitiators or crosslinking agents to facilitate the curing process. The toxicity and volatility of these compounds can present manufacturing difficulties and hazards. PSA's and coatings can have highly reactive unsaturation sites in the polymeric backbone to facilitate external free-radical crosslinking, but depending on the polymer, the unsaturation also provides sites at which the backbone can be degraded by reactions involving radicals.

U.S. Pat. No. 4,556,464 to St. Clair discloses a radiation curable adhesive composition suitable for use as a PSA, comprising a block polymer ABA formulation, where block A is polystyrene/isoprene or polystyrene/butadiene copolymer and block B is polyisoprene, a tackifier compatible with block B and a crosslinking agent compatible with block A.

It is desirable to have PSA's and coatings which are curable without the use of these additive compounds and have saturated polymeric backbones which are not degraded in reactions involving radicals. Therefore, radiation-reactive crosslinking agents may alternatively be incorporated into the polymer backbone, for instance, by copolymerizing with a radiation-sensitive vinyl polymerizable comonomer. Preparing such comonomers on a large scale is generally difficult. Radiation-reactive functionality may also be grafted onto the polymer backbone in a post-polymerization step, however, the resulting polymer is typically a heterogeneous product of low yield due to the difficulty of achieving adequate molecular contact at desired reaction sites. A good discussion of the mechanisms of photochemical reactions in polymers and examples of photoinitiators may be found in J. F. Radek, "Mechanisms of Photophysical Processes and Photochemical Reactions in Polymers Theory and Applications," Chapters 11 and 12, J. Wiley & Sons, 1987, which is hereby incorporated herein by reference.

European patent application 17,364 discloses copolymers curable by actinic radiation, such as UV light, made by incorporating from 0.1 to 10 percent by weight of the copolymer of an allyl benzoylbenzoate comonomer with a polymerizable monoethylenically unsaturated comonomer. These polymers are said to be useful in coating and impregnating formulations, and in adhesive, caulk and sealant formulations.

U.S. Pat. No 4,315,998 to Neckers et al. discloses polymeric materials which incorporate photosensitive functionality via a nucleophilic substitution reaction. The polymeric materials serve as a platform for heterogeneous catalysts for a variety of photoinitiated chemical reactions.

U.S. Pat. Nos. 4,188,215 to Sato et al.; 3,923,703 to Fukutani et al.; 3,867,318 to Nishikubo et al.; 3,694,383 to Azami et al.; and 3,560,465 to Reynolds; and U.K. Patent 1,341,004 all relate to polymeric resins incorporating photosensitive functionality and/or processes for making such resins. These photosensitive resins are generally useful in photographic films.

Photosensitive coatings comprising a blend of a polymer and a photosensitive crosslinking agent are disclosed in U.S. Pat. No. 3,867,27 1 to Malatesta, et al. In this patent, a conjugated diene containing butyl rubber is cured by ultraviolet radiation with the aid of certain photosensitizers. A similar composition said to be useful as a coating for glass substrates is disclosed in U.S. Pat. No. 4,086,373 to Tobias et al., as comprising at least a rubbery thermoplastic organic polymer and an organic photosensitizer.

Photosensitive vinyl monomers are disclosed in U.S. Pat. Nos. 3,429,852 and 3,574,617 both to Skoultchi, wherein ethylenically unsaturated derivatives of substituted benzophenones are prepared by a method involving reacting a substituted benzophenone with an ethylenically unsaturated reagent such as glycidyl acrylate or glycidyl methacrylate. The resulting monomers may thereafter be homo- or copolymerized with a variety of conventional ethylenically unsaturated, i.e. vinyl, monomers. Photosensitive coating systems are prepared by depositing a solid polymer from an organic solvent or an emulsion onto a substrate. The photosensitive coating are said to be particularly suitable for use in various applications including, for example, lithography and chemical milling.

A similar concept is disclosed in U.S. Pat. No. 4,148,987 to Winey, wherein monoethylenically unsaturated derivatives of substituted benzophenones or acetophenones are prepared by a reaction of the benzophenone or acetophenone with a vinyl benzyl halide. These derivatives are polymerizable to form homopolymers, or copolymers with a wide variety of conventional ethylenically unsaturated monomers. The resulting polymers are sensitive to radiation, such as ultraviolet light having a wave length of 2,000 to 5,000 angstroms, and readily crosslink or cure upon exposure to such radiation. Adhesives, binders, coatings and impregnating compositions are made from the polymers.

Radiation-sensitive functionality have also been used to induce crosslinking of a polymeric material in the printing industries where printing plates are initially coated with polymers having light sensitivity. Such radiation-crosslinkable polymers have also been widely used as photoresists in the manufacture of semi-connectors or other engraved articles.

A process by which a polymer is functionalized with radiation-curable moieties is disclosed in U.S. Pat. No.

4,112,201 to Jones, wherein butadiene or isoprene copolymers having pendent unsaturated tetra-aliphatic quaternary nitrogen moieties, such as those derived from acrylic esters and acrylamides are useful as water soluble or inherently water-dispersable curable coatings. Such coatings are useful as protective and/or decorative coatings, paper coatings, textile fiber coatings, printing plates, photocurable imagable materials in photoresists, lithographic plates, etc. The coatings are said to be curable with light, with high energy radiation and with heat in the presence of free-radical catalysts to form insoluble crosslink coatings. The polymers are prepared by amination and a post-polymerization reaction. Likewise, the chemical modification of poly (vinylbenzylchloride) with a photosensitive compound including p-hydroxybenzophenone, 2-hydroxyfluorenone, potassium carbazole, and the like is disclosed in Bailey, et al., *Journal of Applied Polymer Science: Polymer Chemistry Edition*, vol. 17, 777–782 ( 1979).

In Azuma et al., *Journal of Applied Polymer Sciences; Polymer Chemistry Ed.*, vol. 18, 781–797 (1980), the properties and preparation of cis-1,4-polybutadiene and Polypentenamer having pendant functional groups including cinnamoyl groups are disclosed. Cinnamoyl groups are introduced into the polypentenamer, for example, by reacting a Polypentenamer having hydroxymethyl groups with cinnamoyl chloride. Relationships involving the Photosensitivity of cinnamoylated polypentenamer are discussed.

In Azuma et al., *Journal of Applied Polymer Science*, vol. 25, pp. 1273–1286 (1980), there is described an addition reaction of an $\alpha,\beta$-unsaturated carboxylic acid, such as cinnamic acid, to a polydiene, such as cis-1,4-polybutadiene, 1,2 -polybutadiene and polypentenamer, in the presence of an acid catalyst. The unsaturated polydienes undergo cyclization in competition with the incorporation of carboxylate groups. Polymer morphology was said to indicate block segments alternating between cyclic segments and incorporated segments. The polymers were reported to have two glass transition temperatures, and the degree of incorporation against cyclization thereof to be controllable by reaction conditions.

In Azuma et al., *Journal of Applied Polymer Science*, vol. 27, pp. 2065–2078 (1982), there is disclosed a study conducted on the relation of photosensitive cyclized polydienes such as cis-1,4 -polybutadiene, and Polypentenamer having pendent cinnamate groups to the polymer structure. Photodimerization of cinnamate groups was said to be greatly affected by the mobility of the groups, while as the degree of cyclization increased, photosensitivity decreased.

From Azuma et al., *Journal of Applied Polymer Science*, vol. 28, pp. 543–557 (1983), it is known to react Polyisoprene in o-dichlorobenzene solution with maleic anhydride to form polyisoprene modified with $\alpha$-substituted succinic anhydride groups, and to further modify the Polyisoprene by reaction with hydroxyethyl cinnamate in pyridine to incorporate cinnamate groups. It was stated that up to 75 mole percent of the repeating groups could be easily incorporated. Photosensitivity of the modified polyisoprene was said to be greater than that of cinnamate modified polypentenamer due to interaction of the free carboxylate groups. The interaction reduced the dependence of photosensitivity on mobility of polymer segments.

The preparation and use of copolymers of styrene and isobutylene is known in the art. Thus, such copolymers ranging from tough, glassy high polystyrene content copolymers for use in plastic blends, to rubbery low styrene content copolymers for use as impact modifiers, etc., have become well known in this art. Styrene and isobutylene have been copolymerized rather readily in the past under cationic polymerization conditions to yield these copolymers covering the entire compositional range. It is also known that blocky or random homogeneous copolymers can be produced by altering the copolymerization conditions, such as shown in U.S. Pat. No. 3,948,868 to Powers. This patent thus describes the production of random homogeneous polymers comprising at least two cationically polymerizable monomers such as isobutylene and styrene. This disclosure also includes a lengthy list of various olefinic compounds including isobutylene, styrene, $\alpha$-methylstyrene and other such compounds. Furthermore, these compounds have been used in a variety of applications, including use as adhesives in connection with other materials taking advantage of the surface characteristics of the polyisobutylene sequences, as coatings, as asphalt blends, and in various plastic blends. As is discussed in the '868 patent, it is also well known to produce terpolymers including isoprene, but doing so reduces the overall polymer molecular weight rendering the production of high molecular weight polymers therefrom difficult, and complicating the overall production sequence.

There have also been attempts to produce various functionalized polymers. For example, U.S. Pat. No. 3,145,187 to Hankey et al. discloses polymer blends which include a vinyl chloride polymer, a surfactant, and a chlorinated olefin polymer, and the latter is said to include copolymers of various materials which can include isobutylene and styrene, as well as ring-alkyl styrenes, among a large number of other compounds, which olefin polymers can then be chlorinated by known methods.

The literature has also disclosed other routes for obtaining copolymers of isobutylene and styrene, such as that shown in U.S. Pat. No. 4,074,034 to Powers et al. which discloses the copolymerization of isobutylene with halomethylstyrene. This technique requires the use of vinylbenzyl chloride and the like as starting material, and utilizes a specified continuous solution process with solvent or mixed solvent systems in which the monomers are soluble under specified conditions. Aside from the need to employ the expensive vinylbenzyl chloride starting material, these processes also have limitations in terms of the quantity of aromatic chloromethyl functionality which can be incorporated in this manner without encountering excessive chain branching and gel formation during polymerization, and in terms of polymer recovery because of the reactivity of the benzylic chlorine under cationic polymerization conditions. See, "Isobutylene Copolymers of Vinylbenzyl Chloride and Isopropenylbenzyl Chloride," *Journal of Applied Polymer Science*, vol. V, Issue No. 16, pp. 452–459 (1969) in which the aromatic monomer is said to be a mixture of the para and meta isomers.

There has also been some interest in the halomethylation of isobutylene/styrene copolymers, such as discussed in a paper by Sadykhov et al. entitled "Chloromethylation of an Isobutylenestyrene Copolymer and Some of Its Chemical Reactions," *Acerb Neft Khoz.*, 1979 (6) 37–9.

In an article by Harris et al. entitled "Block and Graft Copolymers of Pivalolactone . . . ," *Macromolecules*, 1986, vol. 19, pp. 2903–2908, the authors discuss the copolymerization of isobutylene with styrene and preferably a ring-methylated styrene. This article specifically discloses copolymerization with vinyl toluene, comprising a mixture of meta- and para-methylstyrene in approximately 65/35 amounts, and with para-methylstyrene, for the purpose of producing thermoplastic elastomer pivalolactone copolymer systems with no auto-oxidizable aliphatic unsaturation. The article fails to recognize any difference between the use of vinyl toluene and para-methylstyrene, and in any event, even when it employs the latter, it employs conditions which result in copolymers having the properties, including heterogeneous compositional distribution and very broad molecular weight distribution for the unfractionated copolymer, as set forth in Tables 4 and 5, which include an $M_n$ for the unfractionated copolymer of 16,000, $M_w/M_n$ of 17.45, and a 4-methylstyrene content in the polymer which varies considerably from the monomer feed and varies significantly as a function of molecular weight.

Finally, there are also articles which discuss copolymers of isobutylene and para-methylstyrene without discussing any method for preparing them. These articles include Sadykhov, et al., "Studies of Oxidative Thermal Degradation of Copolymers of Isobutylene with m- and p-Methylstyrenes in a Solution of Mineral Oils," *Uch Zap. Azerb. Un. t. Ser. Khum.*, 1975 (304), 87–92, and other such articles. Furthermore, in Toman, et al., "Isobutylene Polymers and Copolymers with Controlled Structure", App. 78/7, 339, (Nov. 10, 1978), there is reference to the copolymerization of isobutylene with vinyl aromatic monomers. The search has thus continued for useful molecular weight copolymers of isobutylene and alkyl styrenes, and in particular for functionalized copolymers of this type which can be cross-linked, and otherwise used in a variety of applications.

Polymers with a saturated hydrocarbon backbone are well known to possess good environmental and aging resistance which makes them highly desirable in a variety of applications. Furthermore, rubbery copolymers containing major amounts of polyisobutylene are well known to possess low permeability, unique damping properties, and low surface energy which makes them particularly highly desired in many applications. However, the "inertness" of these saturated hydrocarbon polymers, their low reactivity and incompatibility with most other materials, and the difficulties in adhering them to, or using them in conjunction with most other materials has restricted their use in many areas.

In commonly assigned U.S. Ser. No. 441,575, filed Nov. 22, 1989, which is also a continuation-in-part of co-pending U.S. Ser. No. 416,503 filed Oct. 3, 1989, which is a continuation-in-part of co-pending U.S. Ser. No. 199,665 filed May 27, 1988; and co-pending U.S. Ser. No. 416,713 filed Oct. 3, 1989, which is a continuation-in-part of U.S. Ser. No. 199,665 filed May 27, 1988, the disclosures of which are hereby incorporated by reference, it was theorized that the introduction of controlled amounts of the desired specific functionality as pendant groups on the saturated hydrocarbon backbone would greatly extend usefulness by permitting these polymers to be adhered to other surfaces and/or to be co-reacted with or compatibilized with other functional polymers by "grafting" or crosslinking reactions. It was further theorized that the introduction of pendant functionality of the right type and amounts would permit these saturated hydrocarbon polymers to be "painted" or coated with or on other materials, and/or to be laminated with or dispersed in other materials to yield composite materials with a desired combination of properties.

As has been already pointed out, the fact that benzylic halogen functionality constitutes a very active electrophile that can be converted to many other functionalities via $S_N2$ nucleophilic substitution reactions has long been recognized, and the chemical literature is replete with examples of these reactions. Selective conversions in high yield to many functionalities, including the following have been reported: aldehyde, carboxy, amide, ether, ester, thioester, thioether, alkoxy, cyanomethyl, hydroxymethyl thiomethyl, aminomethyl, cationic ionomers (quaternary ammonium or phosphonium, S-isothiouronium, or sulfonium salts), anionic ionomers (sulfonate and carboxylate salts), etc. In addition, the literature described many examples in which a benzylic halogen is replaced by a cluster of other functionalities by nucleophilic substitution with a multifunctional nucleophile such as: triethanolamine, ethylene polyamines, malonates, etc.

Nearly all of this previous work has been with simple, small (i.e. non-polymeric) molecules containing the aromatic halomethyl (or benzylic) functionality. However, a considerable amount of art also exists on nucleophilic substitution reactions involving chloromethyl styrene and polystyrenes containing aromatic chloromethyl groups to introduce other functionalities. Much of this work involves reactions with "styragels" or lightly crosslinked polystyrenes containing various amounts of benzylic chlorine. While many of the same nucleophilic substitution reactions previously reported for small molecules containing benzylic chlorine have been achieved in "styragels," it has been necessary to modify reaction conditions, and in particular to often employ phase transfer catalysts, in order to promote the desired substitution reaction. Reactions involving the benzylic chlorine in polystyrene have been more difficult to achieve than in simple small molecules because of the greater difficulty in achieving the intimate contact required between the reactants when one of the reactants (the aromatic chloromethyl moiety) is in a separate polymeric phase from the other reactant. Yields have also generally been lower and side reactions are more prevalent in the reactions involving the benzylic chlorine in polystyrene. However, since most of the work has been with "styragels," it has generally not been necessary to achieve high conversion in "clean," highly selective substitution reactions in order to preserve polymer solubility. Good recent review of this work involving chloromethyl styrene and "styragels" containing benzylic chlorines are in the literature. See Marcel Camps et al., in "Chloromethylstyrene: Synthesis, Polymerization, Transformation, Applications" in *Rev. Marcromol. Chem. Physics*, C22(3), pp. 343–407 (1982–83); JMJ Frechet in *Chemical Modification of Polymers via Phase Transfer Catalysts in Crown Ethers and Phase Transfer Catalysts in Polymer Science*, edited by Matthews and Canecher and Published by Plenum Press, New York, 1984; and Jean-Pierre Montheard et al., in "Chemical Transformations of Chloromethylated polystyrene" in *JMS-Rev. Macromol. Chem., Phys.*, C-28 (3 & 4), pp. 503–592 (1988).

Previous workers have not applied nucleophilic substitution reactions to isobutylene/para-methylstyrene/para-bromomethylstyrene terpolymers to produce versatile, substantially saturated, pendant functionalized, soluble copolymers.

SUMMARY OF THE INVENTION

The present invention is, in one aspect, the discovery of coating compositions suitable for use in various lithographic and corrosion barrier applications comprising radiation curable copolymers. The term "radiation curable" refers to the vulcanization of the copolymer through exposure to ultraviolet (UV), electron beams (EB), gamma, visible, microwave, and like radiation. The radiation curable copolymer comprises a copolymer of an isoolefin of 4 to 7 carbon atoms and a para-alkylstyrene wherein radiation-reactive functional groups are substituted on the para-alkyl group. In one preferred embodiment, the isoolefin comprises isobutylene, and the para-alkylstyrene comprises para-methylstyrene and/or radiation-curable functionalized para-methylstyrene.

The copolymer can be internally crosslinked utilizing UV or EB radiation and consequently requires no photoinitiator reagent or crosslinking promoter.

In accordance with an embodiment of the present invention, a radiation-curable coating composition comprises the radiation-reactive functionalized copolymer. The radiation-reactive functionalized copolymer comprises an isoolefin having from 4 to 7 carbon atoms and a para-alkylstyrene wherein the copolymer has a number average molecular weight ($M_n$) of at least about 5000, preferably from about 5000 to about 500,000 or greater, and more preferably from about 50,000 to about 300,000. The radiation-reactive functionalized copolymers also preferably have a ratio of weight average molecular weight ($M_w$) to $M_n$ of less than about 6, more preferably less than about 4, most preferably less than about 2.5.

In accordance with a preferred embodiment, the preferred functionalized copolymers employed in the lithographic or corrosion resistant composition and/or method of the present invention are elastomeric, radiation-reactive functionalized copolymers, comprising isoolefin between about 80 and 99.5 percent by weight of the copolymer and para-alkylstyrene between about 0.5 and 20 percent by weight of the copolymer, wherein the radiation-reactive functionalized para-alkylstyrene comprising between about 0.5 and 55 mole percent of the para-alkylstyrene. In accordance with another embodiment, however, where glassy or plastic materials are being produced as well, the radiation-reactive functionalized copolymers comprise isoolefin between about 10 and 99.5 percent by weight of the copolymer, para-alkylstyrene between about 0.5 and 90 percent by weight of the copolymer and radiation-curable functionalized para-alkylstyrene between about 0.5 and 55 percent by weight of the polymer. The coating composition preferably comprises at least about 50 parts by weight of the radiation-reactive functionalized copolymer and from 0 to about 50 parts by weight of the radiation-inactive polymer wherein the parts by weight of the components total 100.

In accordance with a preferred embodiment of the lithographic or corrosion resistant composition and/or method of the present invention, the radiation-reactive functionalized copolymers include the para-alkylstyrene having a radiation reactive functional group affixed to the alkyl group as:

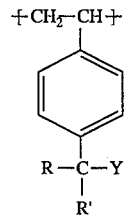

wherein R and R' are independently selected from hydrogen, alkyl, and the primary and secondary alkyl halides, and Y is a radiation-reactive functional group or groups joined to the copolymer via ether, ester, amine or other types of chemical bonds. preferably, these radiation-reactive functionalized copolymers are otherwise substantially free of any additional functional groups in the form of any ring functional groups or any functional groups on the polymer backbone chain (i.e., on the isoolefin carbons).

A precursor copolymer of isoolefin having between 4 and 7 carbon atoms and the para-alkylstyrene used for preparation of the radiation functionalized copolymers described above is formed by admixing the isoolefin and the para-alkylstyrene in a copolymerization reactor under copolymerization conditions in the presence of a diluent, and a Lewis acid catalyst, and maintaining the copolymerization reactor substantially free of impurities which can complex with the catalyst or which can copolymerize with the isoolefin or the para-alkylstyrene. In this manner, precursor copolymers for making the above-described radiation functionalized copolymers are produced as direct reaction products, which, in their as-polymerized form, have a substantially homogeneous compositional distribution, and which can also consist essentially of isoolefin and para-alkylstyrene, and have a number average molecular weight of greater than about 5000. The isobutylene/para-methylstyrene precursor copolymer is insoluble in the preferred diluent, and the process is thus a slurry polymerization process. In another embodiment, however, in which the isobutylene/para-methylstyrene precursor copolymer is soluble in the diluent, a solution polymerization process is described.

The precursor copolymer of the isoolefin and the para-alkylstyrene is then partially selectively brominated to yield a "base terpolymer" containing benzylic bromine functionality. The base terpolymer is produced by selective bromination of one of the benzylic hydrogens of the copolymer of an isoolefin having 4 to 7 carbon atoms and a para-alkylstyrene having the formula:

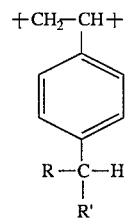

in the presence of bromine and a radical initiator so as to provide a brominated copolymer of isoolefin and para-alkylstyrene which copolymer includes the para-alkylstyrene as:

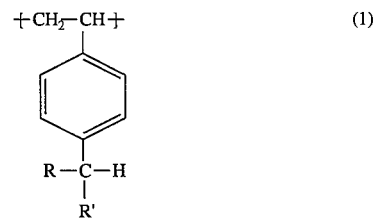 (1)

or as:

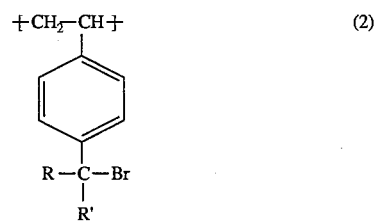 (2)

or as a mixture of (1) and (2), in which R and R' are independently selected from hydrogen, alkyl, and the primary and secondary alkyl halides, and in which the copolymer is otherwise substantially free of ring bromine or any bromine on the polymer backbone chain. In accordance with one embodiment of the selective bromination process the radical initiator is light or heat. In accordance with another embodiment the radical initiator has a half-life of between about 5 and 2500 minutes, and preferably comprises a bis azo compound, Substitution of radiation-reactive functional groups for the benzylic bromine which is a very active and versatile electrophile can be accomplished by nucleophilic substitution reactions to introduce the desired radiation-reactive functionality, and optionally, one or more additional functionalities.

The pendant radiation-reactive functionalized copolymers employed in the lithographic or corrosion barrier coating and/or method of the instant invention can be characterized as a radiation-reactive, nucleophilically substituted, halogenated copolymer of an isoolefin and para-alkylstyrene which copolymer includes the para-alkylstyrene as:

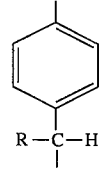
(1)

or as:

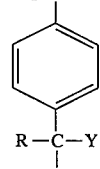
(2)

or as:

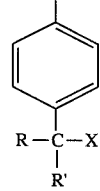
(3)

or as:

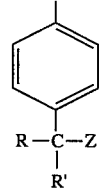
(4)

or as a mixture of (1), (2), and/or (3) and/or (4); wherein R and R' are independently selected from the group consisting of hydrogen, alkyl, preferably $C_1$ to $C_5$ alkyl, and primary or secondary alkyl halides, preferably primary or secondary $C_1$ to $C_5$ alkyl halides; X is selected from the group consisting of chlorine and bromine, preferably bromine; Y represents a new radiation-reactive functional group or functional groups, preferably attached to the polymer via nucleophilic substitution of one of the benzylic halogens: and Z represents an optional additional functional group or groups attached to the polymer via nucleophilic substitution of one of the benzylic halogens which may be non-radiation reactive.

In accordance with a further embodiment of the present invention, a method for making a lithographic, corrosion resistant or other coating comprises the steps of coating at least a portion of a surface of an article with a composition comprising radiation-reactive copolymer recited above and exposing the coating to electromagnetic radiation to induce crosslinking therein. The method may further comprise the steps of forming an image of a pattern on the coating prior to the exposing step to selectively block penetration of the radiation and removing any uncrosslinked coating after the exposing step to reveal the image formed as crosslinked coating. The method may further comprise the step of etching the surface of the article after the removing step wherein a pattern mask is formed in the crosslinked coating.

In yet another embodiment of the present invention, a radiation-crosslinked coating composition comprises a crosslinkable radiation-reactive functionalized composition as recited above wherein at least a portion thereof is crosslinked by electromagnetic radiation. The crosslinked coating may be useful as printing elements and etch masks or corrosion resistant, solvent resistant, shatterproofing and other type coatings.

Other embodiments of the present invention include various articles comprising at least a portion therof the radiation-crosslinked coating composition of the present invention as recited above.

DETAILED DESCRIPTION OF THE INVENTION

The coating composition, preferably as a lithographic, corrosion resistant or sealant coating comprises an isobutylene/para-methylstyrene/para-bromomethylstyrene base terpolymer, functionalized with at least one radiation-reactive functional group.

A. Radiation-Reactive Copolymer

The coating comprises a radiation-reactive copolymer of an isoolefin and para-alkylstyrene including the para-alkylstyrene as:

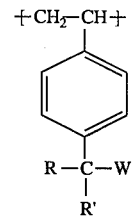

wherein W includes at least Y, and may optionally include a mixture of Y and one or more of hydrogen, X and Z, wherein R, R', X, Y and Z are as defined above. The radiation-reactive substituted para-alkylstyrene (wherein W is Y) may comprise from about 0.5 to about 55 percent by weight of the functionalized copolymer, preferably from about 0.5 to about 20 percent by weight, more preferably from about 0.5 to about 15 percent by weight, and especially from about 1 to about 7 percent by weight of the copolymer. The unsubstituted para-alkylstyrene (wherein W is hydrogen) may comprise from about 0.5 to about 90 weight percent of the functionalized copolymer, preferably from about 1 to about 20 weight percent and especially from about 2 to about 10 weight percent. The radically halogenated para-alkylstyrene (wherein W is X) may comprise up to about 55 percent by weight of the copolymer, preferably less than about 20 percent by weight, and more preferably less than about 15 percent by weight of the copolymer. In a preferred embodiment, substantially complete conversion of the halogenated para-alkylstyrene is obtained, for example, by nucleophilic substitution thereof by Y and/or Z groups, so that the radiation-reactive copolymer is essentially free of the halogenated para-alkylstyrene preferably comprising less than about 1 percent by weight of the functionalized copolymer, more preferably less than about 0.5 percent, most preferably less than about 0.1 percent and especially less than about 0.02 mole percent. Functionalized para-alkylstyrene (wherein W is Z) may be substituted from 0 to about 55 percent by weight of the functionalized copolymer, preferably from 0 to about 20 percent, more preferably from 0 to about 15 percent by weight. The remainder of the radiation-reactive copolymer generally comprises the isoolefin which usually ranges from about 10 to about 99.5 weight percent of the radiation-reactive copolymer, preferably from about 80 to about 99 percent by weight, more preferably from about 90 to about 98 weight percent. The $M_n$ of the radiation reactive copolymer is from about: 5000 to about 500,000, preferably from about 50,000 to about 300,000 and most preferably from about 50,000 to about 150,000.

The radiation-reactive functionality may be derived from various compounds reactive by actinic or electron beam radiation. These comprise photoinitiators from several different well known categories which can be incorporated into the isobutylene/para-methylstyrene/para-bromomethylstyrene base terpolymer by means of nucleophilic substitution reactions between the benzylic halogen leaving group and the nucleophilic compound containing the photoinitiator moiety. Representative photoinitiators include:

(a) aromatic aldehydes and ketones such as benzophenone, 4-chlorobenzophenone, 4-hydroxybenzophenone, benzoquinone, naphthaquinone, anthraquinone, 2-chloroanthraquinone, benzylidene aceto-phenone, acetophenone, propiophenone, cyclopropyl phenyl ketone, benzaldehyde, β-napthylphenyl ketone, β-napthaldehyde, β-acetonaphthone, 2,3-pentanedione, benzil, fluorenone, benzanthrone, Michler's ketone, bis(parahydroxybenzylidene)acetone, benzoin, deoxybenzoin, chlorodeoxybenzoin and the like;

(b) alkoxy and acyl substituted aromatic compounds such as 2,2-dimethyloxy-2-phenyl, 1,3,5-triacetyl benzene, 2,5-diethoxy stilbene, and the like;

(c) hereto aromatic compounds such as thioxanthone and the like;

(d) fused ring polycyclic aromatic compounds such as anthracene, pyrene and the like;

(e) N,N-disubstituted dithiocarbamates;

(f) conjugated unsaturated fatty acids such as tung oil acid and derivatives thereof;

(g) α,β-unsaturated aromatic carboxylic acids having the formula:

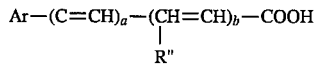

wherein R" is selected from the group consisting of H, CN, and $NO_2$ a and b are 0 or 1; and Ar is an aryl group such as, for example, phenyl, m-nitrophenyl, p-chloropnenyl, acetoxy phenyl, styryl, styryl phenyl, p-methoxyphenyl, 1-naphthyl, 2-naphthyl, 9-anthryl, 2-furfuryl and 2-thienyl, and may be substituted by one or more additional groups such as, for example, hydrocarbyl, nitro, chloro, alkoxy, azide and sulfonazide (representative examples of these aromatic carboxylic acids include benzoic acid, cinnamic acid, m-nitrocinnamic acid, p-chlorocinnamic acid, p-methoxycinnamic acid, chalcone acrylic acid, p-phenylenebis(acrylic acid), p-azidobenzoic acid, p-sulfonazidobenzoic acid, α-cyanocinnamic acid, cinnamylideneacetic acid, cinnamylidene-malonic acid, α-cyanocinnamylideneacetic acid, β-(1)-naphthylacrylic acid, β-(2)-furfuryl-acrylic acid, α-cyano-β-(2)-thienylacrylic acid, β-(1) naphthylacrylic acid, β-(9)-anthrylacrylic acid and esters and salts thereof, (e.g. sodium benzoate) and the like).

(h) nitro aromatic compounds such as, for example, picramide, nitronaphthalene, 5-nitroacenaphthlene, 2-nitrofluorene and the like;

(i) dye compounds such as rose bengal, acridine orange, chlorophyllin, crystal violet, eosin Y, fluorescein, flavin mononucleotide, hematoporphyrin, hemin, malachite green, methylene blue, rhodamine B, chlorophyll, cosine, erthrosin, methylene green, toluidine blue, thionine, and the like;

(j) azide-containing compounds such as azidobenzene, p-phenylene bisazide, p-azidobenzophenone, 4,4-diazidobenzophenone, 4,4'-diazidodiphenylmethane, 4,4'-diazidostilbene, 4,4'-diazidochalcone, 3,6-di(4'-azidobenzal)cuclohaxanone, 2,6-di(4'-azidobenzal)-4-methylcyclohexanone, and the like:

(k) diazonium salt radicals such as p-diazodiphenylamineparaformaldehyde condensates, 1-diazo-4-dimethylaminobenzene hydrofluoroborate, 1-diazo-3-methyl-4-dimethylaniline sulfate and the like; and (l) multifunctional compounds containing the above photosensitive groups such as 1,2-naphthoquinonediazide, 2,3,4-trihydroxybenzophenone, bis-(naphthoquinone-1,2-diazido-5-sulfonate), 2-(naphthoquinone-1,2-diazido-5-sulfonyloxy)-3-hydroxynaphthalene, naphthoquinone-1,2-diazido-5-sulfonic acid novolak ester, naphthoquinone-1,2-diazido-5-sulfanilide, azidobenzoic acid, azidophthalic acid, and the like; and (m) metal chelate compounds such as benzene chromium tricarbonyl and the like.

A comprehensive discussion of photoinitiators is found in the Radek publication mentioned earlier. These compounds generally either contain suitable reactive moieties for functionalization of the halogenated isoolefin/para-alkylstyrene base terpolymers via nucleophilic substitution, or can be readily modified to incorporate suitable reactive moieties such as hydroxy or carboxyl radicals or carboxylate salts or esters.

Coating performance as a lithographic or corrosion resistant film depends on the content and type of the radiation-reactive functionalized copolymer or copolymer blend, as well as the crosslink density. Crosslink density is a direct function of radiation exposure and the type and concentration of radiation-sensitive functionality. Important variables in determining the type of functionality include the desired degree of functionalization and wavelength of energy absorbance. Also, the photopolymer must generally exhibit good crosslinking response when irradiated in the presence of any additional components contained in the coating composition including any additives and/or extenders.

The cinnamate derivative photopolymer, for example, absorbs high levels of irradiated energy because of its strong absorbance. Consequently, coating systems incorporating cinnamates as a UV-reactive functionality generally require higher doses of UV radiation and have shallower crosslink depths. These systems work best with thin coatings, and are particularly desirable in applications wherein crosslinking is to be restricted to an outer layer or shell exposed to the UV radiation. Coatings incorporating benzophenone on the other hand do not absorb as much UV energy because of its weaker absorbances, and they have high hydrogen abstraction reactivity from the photoexcited state. Consequently, coating systems including benzophenone require reduced UV radiation doses and have greater crosslink depth.

Selection of the type of functional group also involves considering the radiation wavelength to be employed to excite the functional group. Among those which are reactive to UV wavelengths include cinnamates, benzophenones, thioxanthones, anthraquinones, dithiocarbamates, and the like. On the other hand, naphthoquinone-derivatized photopolymers, for example, are sensitive to visible light, while tung oil acid derivatives are an example of a polymer crosslinkable by high energy radiation such as gamma and electron beam radiation.

Coating performance, e.g., adhesion to various substrates, is also dependent upon composition of the polymer backbone, including the molecular weight, architecture and concentration of para-methyl styrene, i.e., the degree to which the radiation-reactive polymer is elastomeric-like (high in isobutylene, low $T_g$) versus the degree to which it is thermoplastic-like (higher in para-methylstyrene, high $T_g$). Increasing para-methylstyrene concentration in the polymer backbone generally contributes to an overall increase in $T_g$, and consequently, is a variable for optimization.

Likewise related is optimization of molecular architecture, i.e. branched versus linear molecules. Incorporation of other functionality into radiation curable coating systems opens new variables for even greater control of polymeric architecture and property optimization for a variety of different substrates.

The paths taken by radiation-reactive crosslinking depend on the type of functionality incorporated. For example, the cinnamate derivative copolymer, e.g. cinnamoyl (φCH═CH—C(O)—), undergoes 2+2 photocycloaddition upon UV initiation:

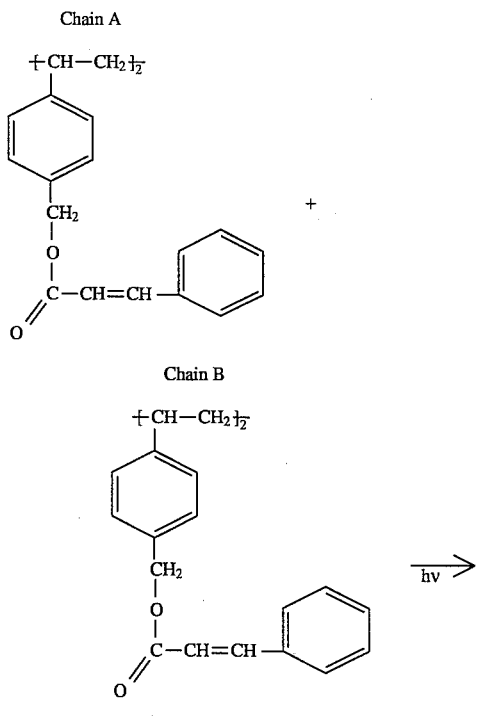

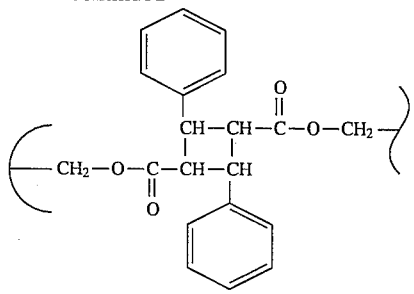

On the other hand, the benzoylbenzoate derivative undergoes free radical crosslinking under UV exposure The incorporated benzophenone moiety is a well known photoinitiator in that it reacts with UV radiation to produce a free radical in the enchained benzophenone functionality via a hydrogen abstraction mechanism. The N,N-disubstituted dithiocarbamate derivative also undergoes radical crosslinking upon UV exposure. Crosslinking is attributed to the ready ability of the dithiocarbamate ester functionality to form stable radicals under irradiation to permit radical crosslinking and other radical chemistry reactions to occur, rather than backbone cleavage as normally occurs with isobutylene based polymers.

Tung oil fatty acid is a fatty acid high in eleostearic acid derived from tung oil and containing conjugated unsaturations. Exposure to electron beam irradiation initiates crosslinking in the tung oil ester functionalized copolymer.

The anthraquinone-2-carboxylate ester functionalized copolymer contains the photoinitiator anthraquinone. UV irradiation initiates radical crosslinking.

The presence of other functionality is optional and may be either interdispersed on a single functionalized base copolymer with multiple functional groups (of which at least one is radiation-reactive), or two or more functionalized copolymers may be blended together. The presence of the additional functionality enables other desirable properties to be incorporated into a coating system. For example, the presence of amine functionality in addition to radiation-curable functionality can facilitate emulsification application of radiation-curable lithographic coatings. Also, the amine derivatives can be used in combination with the benzophenone photoinitiation to provide easily abstracted protons.

As another example of mixed functionality, certain radiation-reactive functional groups act as energy amplifiers and transfer agents for other radiation-reactive groups, thereby allowing for enhanced sensitivity of selected coatings with lower energy absorbance in a wider frequency range. Photoexcitable acroleinium salt functionality present in a coating composition can act as an energy amplification and transfer agent for cinnamate groups which otherwise have a high UV absorbance, low UV transmissivity, and a narrow UV frequency photoinitiation range. The addition of the photoexcitable functionality can allow for greater curing depth and/or thicker coatings in a cinnamate-based system.

The radiation-reactive copolymer includes at least one radiation-reactive functionality so the coating composition is curable by electromagnetic radiation. By incorporating the photoinitiator directly onto the pendant para-methylstyrene groups randomly dispersed in the polyisobutylene backbone, the polymer can be cured directly by electromagnetic radiation. Furthermore, radiation-curable systems containing a single derivatized copolymer or a blend of several copolymers with at least a single radiation-curable functionality and other functional groups can be tailored lithographic or corrosion barrier systems containing specific functional groups to enhance adhesion to specific substrates, both polar and non-polar categories. For example, the presence of carboxylic acid functionality can enhance aluminum adhesion whereas silane functionality enhances adhesion to glass. In addition, silane functionality may be useful in semiconductor manufacturing processes requiring organosilicon polymer photoresist coatings, i.e. multilayer lithography.

It is understood that the above illustrative examples should not be considered limiting as one having ordinary skill in the art can determine embodiments of systems for lithographic or corrosion barrier coatings with useful multiple functional groups incorporated therein other than the ones described above.

B. Other Resin Components

An optional component of the lithographic or corrosion resistant coating compositions of the present invention is a tackifier suitable for use with UV- or EB-reactive copolymers. Suitable tackifiers include those resins which are compatible with the copolymer or copolymer blend. Tackifiers are chosen to impart substantial adhesive strength, promote substrate wetting and generally enhance coating performance, e.g., optimize tack performance versus temperature performance of the cured composition where applicable. The tackifier must generally not substantially interfere with the photosensitivity of the UV- or EB-reactive polymer(s) and the ability for gel conversion.

Tackifier components suitable for use in this invention include aliphatic and aromatic hydrocarbon resins such as ESCOREZ or WINGTACK 95. WINGTACK 95 is the tradename for a diene-olefin copolymer of piperylene and 2-methyl-2-butene having a softening point of 95° C. The resin is prepared by the cationic polymerization of 60 weight percent piperylene, 10 weight percent isoprene, 5 weight percent cyclopentadiene, 15 weight percent 2-methylbutene and about 10 weight percent dimer. See U.S. Pat. No. 3,577,398. Other tackifying resins of the same general type may be employed in which the resinous copolymer comprises 20–80 weight percent of piperylene and 80–20 weight percent of 2-methyl-2-butene. Other adhesion-promoting resins which are also useful in the compositions of this invention include hydrogenated rosins, rosin esters, polyterpenes, terpenephenol resins, and polymerized mixed olefins. Hydrogenated hydrocarbon resins obtained under the trade designation ESCOREZ 5380 and ECR-143H are preferred because unsaturation present in the tackifier may reduce the conversion of polymer to gel through radiation energy absorption or through tackifier participation in crosslinking when the coating is cured. These tackifiers typically have a ring and ball softening point from about 10° C. to about 180° C., preferably from about 15° C. to about 75° C. Other hydrocarbon tackifiers obtained from Exxon Chemical Co. under the trade designations ECR-111, and ECR-327 have also been found to be particularly preferred. ECR-143H resin, for example, is prepared by the cationic polymerization of a $C_5$ olefin/diolefin feed stream as described in U.S. Pat. No. 4,916,192 which is hereby incorporated by reference herein.

PSA properties are dependent on selection of tackifier resin. Particularly important is the $T_g$ of the tackifier. Optimization studies show that tack-related properties which are nominally inversely proportional to crosslink density can be improved by optimizing the $T_g$ of the PSA system. Selection of tackifier is an important variable in this regard. For example, when ECR-143H and ECR-111 tackifiers were blended together in equal proportions, several tack properties improved in PSA system incorporating the blended tackifier ever PSA systems incorporating each individual tackifier resin. General tackifier composition is also a strong variable in PSA property optimization. The presence of aromaticity is beneficial for compatibility.

An additional optional component of the coating composition of the present invention is a radiation inactive polymer wherein such addition does not interfere with the necessary radiation sensitivity. Radiation inactive resins may act as low cost extenders or introduce other desired functionality.

c. Preparation and Utility of the Coating Composition

Coating systems which are an embodiment of this invention may optionally contain a non-radiation-reactive resin including both tackifiers and high polymers blended up to about 50 parts by weight and the functionalized polymer having at least one radiation-reactive functional group in an amount of 50 parts by weight or more wherein the parts by weight of the radiation- and non-radiation-reactive components total 100.

Other additives may include antioxidants, non-polymeric organic or inorganic particulated fillers or reinforcing agents, coupling agents, dyes and pigments, and the like which do not appreciably obstruct the radiation crosslinking.

The antioxidant or stabilizer can be added at from about 0.1 to about 3 percent by weight, preferably from about 0.1 to about 1.5 percent by weight, more preferably from about 0.1 to about 1 percent by weight, and typically at about 0.5 weight percent.

Particulated fillers which may be also used for thickening and price reduction include glass, silica, amorphous $SiO_2$, fumed alumina, calcium carbonate, fibers and the like. Suitable commercially available fillers are available under the trade designations CAB-O-SIL, ZEOSIL 35, AEROSIL R972, DUCRAL 10 and the like.

Suitable coupling agents include (but are not limited to) organometallic compounds such as, for example, silane-based compounds, organotitanates, organozirconates, organozircoaluminates, chrome complexes and the like. These are generally selected to promote adhesion based on the substrates and/or fillers involved in the particular application.

Suitable dyes include Fuchsine (CI 42510), Calcocid Green S (CI 44090), Solvent Yellow 34 (CI 4100B), and the like. Suitable pigments include titanium dioxide, colloidal carbon, graphite, ceramics, clays, phosphor particles and metal particles, e.g. aluminum magnetic iron, copper, and the like.

The coating compositions of this invention are preferably prepared as organic solvent solutions of the radiation-reactive copolymer and any other components, although copolymer emulsions and hot melts may also be used if so desired. The coating compositions may be applied to the substrate from a solution of up to about 40 percent weight solids of the ingredients in a solvent such as toluene, the solvent being removed by evaporation prior to crosslinking by exposure to the radiation. Alternatively, the ingredients may be mixed in a solvent, the mixture may be emulsified and the solvent evaporated, and the coating may be applied to a substrate as 50–60 percent weight solids emulsion, the water being removed by evaporation with conventional drying equipment and techniques prior to crosslinking.

For hot melt application, the coating compositions may be prepared by blending the radiation-reactive polymer with any optional component in the melt until a homogeneous blend is obtained. Various methods of blending materials of this type are known to the art, and any method that produces a homogeneous blend is satisfactory. Typical blending equipment includes, for example, mixing extruders, roll mills, Banbury mixers, Brabenders and the like. In general, the blend components blend easily in the melt and a heated vessel equipped with a stirrer is all that is required. The components are added in no particular order, but generally the polymer resin is added first and heated in the vessel until molten. Thereafter, any optional components are then added.

The hot melt formulation may be cooled and later reheated for use, or used directly, e.g. supplied from a reservoir or melt pot to a substrate using conventional equipment, for example, for pumping or pressure extrusion through slot dies. An important feature of the present invention is that the hot melt formulation has a good melt pot stability so that appreciable premature curing of the formulation is not usually encountered at typical hot melt conditions, such as, for example, from about 60° C. to about 140° C. Generally, the hot melt is heated sufficiently for a target viscosity of about 100,000 cps, although a viscosity as high as 150,000 cps can usually be tolerated. For suitable pot stability, the viscosity of the hot melt should not increase more than 20 percent when maintained at the pot temperature for a period of 8 hours.

The preparation of coated articles such as films, sheets, plates and molded objects involves the initial step of coating ar least a portion of a surface of the selected article with a solution, emulsion or hot melt of the radiation-reactive composition. Any suitable coating technique may be employed while applicable substrates, including composites thereof, may be comprised of paper and paperboard; fiberglass; wood; graphite; conductive metals, e.g. copper, aluminum, zinc, and steel, etc.; and semi-conductive substrates such as silicon and gallium arsenide; glass and ceramic; textiles, both natural and synthetic, woven and non-woven; synthetic resins including the homo- and copolymers of ethylene, propylene, vinyl chloride, vinylidene chloride, vinyl acetate, styrene, isobutylene, and acrylonitrile; polyvinyl acetal; polyethylene terephthalate; polyamides and, cellulose esters such as cellulose acetate and cellulose butyrate. The latter polymeric substrates may contain fillers or reinforcing agents such as the various synthetic, natural or modified fibers such, for example as cellulosic fiber, e.g. cotton, cellulose acetate, viscose rayon, and paper; glass; and, polyamide fibers. These reinforced substrates may be issued in laminated or composite form.

The coating of the radiation-reactive copolymer composition should be applied to the substrate surface so that upon drying its thickness will be in the range of about 0.05 to about 10 mils. Drying of the wet polymer coating may be achieved by air drying or by the application of any other particular drying technique whose use is favored by the practitioner. The substrate comprising the radiation-reactive coating may be stored for prolonged periods before its ultimate utilization.

Suitable sources of actinic radiation employed to effect the crosslinking reaction include carbon arc, mercury-vapor arc and fluorescent sun lamps. The electron beam radiation or high energy ionizing radiation can be obtained from any suitable source such as an atomic pile, a resonant transformer accelerator, a Van de Graaf electron accelerator, a Linac electron accelerator, a betatron, a synchrotron, a cyclotron, or the like. Radiation from these sources will produce ionizing radiation such as electrons, protons, neutrons, deuterons, gamma rays, X-rays, $\alpha$-particles and $\beta$-particles.

The crosslinking reaction is conveniently effected at room temperature, but it can be conducted at depressed or elevated temperatures if desired. It is also within the spirit and scope of the invention to effect the crosslinking reaction within the confines of an inert atmosphere to prevent air inhibition of the crosslinking reaction and to prevent oxidative degradation of the polymer. The amount and kind of radiation required depends primarily on the type and amount of radiation-sensitive functionality employed, thickness of the coating and the level of curing desired. Suitable doses of EB radiation include from about 0.2 megarad to about 20 megarad, preferably from about 1 megarad to about 10 megarad. Suitable doses of UV radiation include from about 0.05 to about 2 J/cm$^2$, preferably from about 0.1 to about 1 J/cm$^2$.

The resulting crosslinkable compositions can be used for a wide variety of applications including lithographic, corrosion resistant, barrier and other applications where high oil, grease and solvent resistance as well as increased stiffness resulting from a crosslinked matrix are required. Specifically, they may be used in photo-reproduction processes such as in photography, photomechanical reproductions, lithography and intaglio printing; in processes requiring photo-etch-resist masks wherein it is desirable to engrave or etch intricate shapes and/or designs such as microcircuit designs without the use of cutting tools; as corrosion barrier films on metals; as water, oil and/or solvent-proofing of coated articles including, paper, cardboard, textiles, plastics, elastics; shatterproofing coatings on glass; caulks and sealants; and the like.

Lithography generally refers to processes for pattern transfer between various media. A lithographic coating is generally a radiation-sensitized coating suitable for receiving a projected image of the subject pattern. Once projected, the image is indelibly formed in the coating. The projected image may either be a negative or positive of the subject pattern. Typically, a "transparency" of the pattern is made having areas which are selectively transparent or opaque to the "projecting" radiation. Exposure of the coating through the transparency causes the image area to become selectively crosslinked and consequently either more or less soluble (depending on the coating) in a particular solvent developer. The more soluble, i.e. uncrosslinked, areas are removed in the developing process to leave the pattern image in the coating as less soluble crosslinked polymer.

Suitable developing solvents include perchloroethylene, methylene chloride, ethylene dichloride, methyl ethyl ketone, n-propanol, toluene, benzene, ethyl acetate and water, where applicable. The solvent liquid used for this operation must be selected with care since it should have good solvent action on the unexposed areas, yet have little action upon either the insolubilized copolymer or the substrate. The developing solvent should be allowed to remain in contact with the coating for a period of from about 30 seconds to 3 minutes depending upon the particular solvent being utilized. The thus developed polymer coating should next be rinsed with fresh solvent and thereupon dried.

The developing process, particularly in printing applications, may also comprise several different steps including etching of an underlying substrate to enhance the height of the relief image area, removing the uncrosslinked coating and altering the hydrophilic properties of the substrate.

The present invention has utility in photo-reproduction processes where the crosslinked coating remains as raised printing elements generally on a plate. Ink may be carried by the raised portion of the plate as in dry-offset printing and ordinary letterpress printing, or may be carried by the recessed portions of the plate such as in intaglio printing, e.g. line and inverted halftone. Thickness of the radiation-reactive layer is a direct function of the thickness desired in the relief image and this will depend on the subject being reproduced and particularly on the extent of the non-printing areas. Further examples of such uses are offset printing, silk screen printing, duplicating pads, manifold stencil sheeting coatings, lithographic plates, relief plates, gravure plates, photoengraving, collotype and planographic type elements, magenta screens, screen stencils, dyeable images of the halftone and continuous type, in direct positive and negative systems utilizing wet development which incorporate color formers and coupling agents in vapor developed systems which incorporate diazonium salts and coupling agents.

In making a negative surface plate, the coated plate is placed in a vacuum printing frame and the negative positioned accurately over it. The frame is closed and a vacuum applied to pull the negative into close contact with the plate for exposure to a powerful light source for example. The light passes through the clear areas of the negative to harden the plate coating, and the plate is removed from the frame and the image is developed.

In producing deep-etch litho plates, the coating is exposed to light through a positive. The unhardened areas are washed away, but in this case the function of the hardened areas is not to act as the litho plate but to form a protective stencil while the image areas are lightly etched and then filled with a hard lacquer.

Bimetal plates take advantage of the fact that oil and water do not wet all metals with the same ease. An oleophilic metal, such as copper, is used for the image and hydrophilic metal, for example chromium, for the nonimage areas. The method of platemaking is similar to that used in the deep-etch process but the purpose of etching is to remove a thin layer of chromium to leave bare copper exposed to form the image.

These lithographic coating compositions are also useful as resist layers (i.e. photoresists) in carrying out chemical and other type etching or engraving operations. Following pattern transfer and removal of the uncrosslinked coating, the crosslinked coating comprises a mask for the etching step. Applications include the preparation of ornamental plaques or for producing ornamental effects; as patterns for automatic engraving machines, foundry molds, cutting and stamping dies, name stamps, relief maps for braille, as rapid cure coatings, e.g. on film base; as television phosphor photobinders, as variable area sound tracks on film; for embossing plates, paper, e.g. with a die prepared from the radiation-sensitive coating; particularly as photoresists in the manufacture of printed circuits, other plastic articles and microchips.

In semiconductor manufacturing processes, for example, the exposed and developed resist becomes a pattern mask for anisotropic etching of an underlying layer and/or semiconductor substrate. The etching is typically carried out by chemical or plasma means to which the mask is inert. The steps of exposing and developing the resist layer with a suitable pattern is similar to the method described earlier for producing printing elements. Following anisotropic etching, the resist layer may be removed by an isotropic plasma or chemical etch to which the mask polymer is not inert.

The radiation-curable coating compositions of the present invention can readily be shaped into films, sheets, and other molded articles and then exposed to active radiation, such as visible, ultraviolet, or high energy radiation, to crosslink the polymers and thereby render them infusible and insoluble for use as corrosion resistant, solvent resistant and other barrier coatings.

The present coating composition may be used as a corrosion resistant barrier coating on various metal surfaces in intimate contact with corrosion-causing fluids or gases including water, seawater, high and low pH fluids, and the like or exposed to a corrosion-causing environment. Examples include, liners in food and beverage containers; liners in vessels, pipes, and miscellaneous equipment used in manufacturing plants, ships, and the like; and anti-rust coatings for automobiles, etc.

As other useful coatings, the uncrosslinked copolymers may be used as film-forming binders or adhesives in the production of various coating and/or impregnating compositions for application to papers and textiles which after irradiation can be rendered resistant to removal by heating or solvents. The copolymers can be used as binders for non-woven fabrics or webs. They may be applied uniformly over the entire area of the non-woven web or in any predetermined pattern, e.g. along intersecting sets of parallel lines, either straight or curved in a regular or even somewhat irregular array. The impregnated non-woven web may then be subjected to actinic radiation, for example, to crosslink the polymer wherever it is present, thereby rendering the treated non-woven web more or less resistant to disintegration by water or solvents.

As a web coating the present invention may be applied uniformly throughout the area of the web and then the web may be crosslinked in a predetermined pattern through a light filter or opaque screen so that only selected areas of the polymer film coating are effected. After the screened exposure, the unexposed portions of the coating may be removed.

In such methods, the coatings of the present invention may be used to produce "wet wipes", disposable diapers and/or diaper covercloths. The use of a screen of filter can control the extent of crosslinking selectively in various areas of the bonded diaper or diaper covercloth so that, for example, the crotch areas can be rendered resistant to disintegration by water-soaking whereas the peripheral ares can be disintegrated within a short time of half a minute to two minutes or so on soaking in water.

In addition, the coating compositions of the present invention may be applied as sealants and caulks at low viscosity and cured by exposure to UV or EB radiation and as protective shatter-proofing coatings for glass and other articles comprising brittle materials.

D. Preparation of the Radiation-Reactive Copolymer

1. Copolymer Precursor Preparation

This invention is, in part, based upon the discovery that the polymerization of isoolefin and para-alkylstyrene under certain specific polymerization conditions now permits one to produce radiation-functionalizable (via halogenation and nucleophilic substitution) precursor copolymers which comprise the direct reaction product (that is, in their as-polymerized form), and which have unexpectedly homogeneous uniform compositional distributions. Thus, by utilizing the polymerization procedures set forth herein, the polymeric backbones, or precursor copolymers of the novel functionalized copolymers employed in the coating compositions of the present invention can be produced. These copolymers, including the radiation-reactive copolymers, as evaluated by gel permeation chromatography (GPC), demonstrate narrow molecular weight distributions and substantially homogeneous compositional distributions, or compositional uniformity over the entire range of compositions thereof. Put another way, at least about 95 percent by weight of the precursor copolymer product has a para-alkylstyrene content within about 10 percent by weight, and preferably within about 7 percent by weight, of the average para-alkylstyrene content for the overall composition, and preferably at least about 97 percent by weight of the copolymer product has a para-alkylstyrene content within about 10 percent by weight, and preferably within about 7 percent by weight, of the average para-alkylstyrene content for the overall composition. In a most preferred embodiment hereof, this is demonstrated by the fact that the normalized differential refractive index (DRI) and ultraviolet (UV) curves obtained by GPC for these functionalized copolymers are essentially superimposeable on each other and substantially merge into a single curve in most instances. This substantially homogeneous compositional uniformity thus particularly relates to the intercompositional distribution. That is, with the precursor copolymers of this invention, as between any selected molecular weight fraction the percentage of para-alkylstyrene there in, or the ratio of para-alkylstyrene to isoolefin, will be substantially the same, in the manner set forth above. Since the relative reactivity of para-alkylstyrene with isoolefin such as isobutene is close to 1.0, the intracompositional distribution of these copolymers will also be substantially homogeneous. That is, these precursor copolymers are essentially random copolymers, and in any particular polymer chain the para-alkylstyrene and isoolefin units will be essentially randomly distributed throughout that chain.

The properties of these precursor copolymers leads to a number of distinct advantages over the prior art, including the ability to produce useful functionalized copolymers having number average molecular weights generally greater than about 5000. The precursor copolymers useful for radiation-reactive functionalization in the coatings, methods and articles of the present invention include compositionally homogeneous copolymers having number average molecular weight ($M_n$) from about 5000 to about 500,000, preferably from about 50,000 to about 300,000, more preferably from about 50,000 to about 150,000. These products also exhibit a relatively narrow molecular weight distribution. In particular, these functionalized copolymers thus exhibit $M_w/M_n$ values of less than about 6, preferably less than about 4, more preferably less than about 2.5 and at the same time, depending upon the ultimate intended use thereof.

Thus, distributed throughout the precursor copolymer are the para-methylstyrene units:

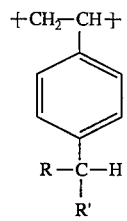

in which R and R' are, independently, selected from the group consisting of hydrogen, alkyl, preferably $C_1$ to $C_5$ alkyl, and primary and secondary alkyl halides, preferably primary and secondary $C_1$ to $C_5$ alkyl halides.

With respect to the ratio of the monomers employed to produce the precursor copolymers for nucleophilic functionalization into radiation sensitive copolymers, it is a distinct advantage of the present invention that a very wide range of the ratio of the monomers in the precursor copolymer product can be utilized in accordance with this invention. It is therefore possible, for example, to produce precursor copolymer products which operably comprise from about 10 to about 99.5 percent by weight, preferably between about 80 and 99 percent by weight, and most preferably from about 90 to about 98 percent by weight of the of the isoolefin or isobutylene and from about 0.5 to about 90 percent by weight, preferably from about 1 to about 20 percent by weight, more preferably from about 2 to about 10 percent by weight of the para-alkylstyrene, preferably para-methylstyrene. On the other hand, it is also possible to produce thermoplastic materials comprising higher concentrations of para-alkylstyrene, and therefore the copolymers comprise from about 10 to about 99.5 percent by weight of the isoolefin, preferably isobutylene, and from about 0.5 to about 90 percent by weight, preferably from about 1 to about 90 percent by weight of the para-alkylstyrene, or preferably para-methylstyrene.

Isobutene and para-methylstyrene are readily copolymerized under cationic conditions. The polymerization can be carried out by means of a Lewis acid catalyst. Suitable Lewis acid catalysts (including Friedel-Crafts catalysts) include those which show good polymerization activity with a minimum tendency to promote alkylation transfer and side reactions which can lead to branching and the production of crosslinks resulting in gel-containing polymers with inferior properties. The preferred catalysts are Lewis acids based on metals from Group IIIa, IV and V of the periodic table of the elements, including boron, aluminum, gallium, indium, titanium, zirconium, tin, vanadium, arsenic, antimony, and bismuth. The Group IIIa Lewis acids have the general formula $R_mMX_n$, wherein M is a Group IIIa metal, R is a monovalent hydrocarbon radical selected from the group consisting of $C_1$ to $C_{12}$ alkyl, aryl, alkylaryl, arylalkyl and cycloalkyl radicals; m is a number from 0 to 3; X is a halogen independently selected from the group consisting of fluorine, chlorine, bromine, and iodine; and the sum of m and n is equal to 3. Nonlimiting examples include aluminum chloride, aluminum bromide, boron trifluoride, boron trichloride, ethyl aluminum dichloride ($EtAlCl_2$), diethyl aluminum chloride ($Et_2AlCl$), ethyl aluminum sesquichloride ($Et_{1.5}AlCl_{1.5}$), trimethyl aluminum, and triethyl aluminum. The Group IV Lewis acids have the general formula $MX_4$, wherein M is a Group IV metal and X is a ligand, preferably a halogen. Nonlimiting examples include titanium tetrachloride, zirconium tetrachloride, or tin tetrachloride. The Group V Lewis acids have the general formula $MX_y$, wherein M is a Group V metal, X is a ligand, preferably a halogen, and y is an integer from 3 to 5. Nonlimiting examples include vanadium tetrachloride and antimony pentafluoride.

The preferred Lewis acid catalysts may be used singly or in combination with co-catalysts such as Brønsted acids, such as anhydrous HF or HCl, or alkyl halides, such as benzyl chloride or tertiary butyl chloride. In particular, the most preferred catalysts are those which can be classified as the weaker alkylation catalysts, and these are thus the weaker Lewis acids from among the catalysts set forth above. These most preferred catalysts, such as ethyl aluminum dichloride, and preferably mixtures of ethyl aluminum dichloride with diethyl aluminum chloride, are not the catalysts that are normally preferred for use in conventional alkylation reactions, since again in the present case there is a strong desire to minimize side reactions, such as the indenyl ring formation which would be more likely to occur with those catalysts normally used to promote conventional alkylation reactions. The amount of such catalysts employed will depend on the desired molecular weight and the desired molecular weight distribution of the copolymer being produced, but will generally range from about 20 ppm to about 1 percent by weight, and preferably from about 0.001 to about 0.2 percent by weight, based upon the total amount of monomer to be polymerized therein.

Suitable diluents for the monomers, catalyst components and polymeric reaction products include the general group of aliphatic and aromatic hydrocarbons, used singly or in admixture, and $C_1$ to $C_6$ halogenated hydrocarbons used in admixture with hydrocarbon diluents in an amount up to about 100 percent by volume of the total diluent fed to the reaction zone. Typically, when the monomers are soluble in the selected diluent, the catalyst may not necessarily also be soluble therein.

The process can be carried out in the form of a slurry of polymer formed in the diluents employed, or as a homogeneous solution process. The use of a slurry process is, however, preferred, since lower viscosity mixtures are produced in the reactor, and slurry concentrations of up to about 40 percent by weight of polymer are possible. At higher slurry concentrations it is possible to operate a more efficient process in which it is necessary to recycle less of the reactants and diluent for each unit of polymer produced. For instance, at 33 percent slurry concentration it is only necessary to recycle two units of unreacted reactants and diluent for each unit of polymer. In any event, the amount of diluent fed to the reaction zone should be sufficient to maintain the concentration of polymer in the effluent leaving the reaction zone below about 60 percent by weight, and preferably in the range from about 5 to about 35 percent by weight, depending upon the process being used and the molecular weight of polymer being produced. Too high a concentration of polymer is generally undesirable for several reasons, including poor temperature control, rapid reactor fouling, and the production of gel. Polymer concentrations which are too high will raise the viscosity in the reactor and require excessive power input to insure adequate mixing and the maintenance of effective heat transfer. Such inadequate mixing and loss of heat transfer efficiency can thus result in localized high monomer concentrations and hot spots in the reactor which can in turn cause fouling of reactor surfaces. However, the prior art tendency for gel production at higher polymer concentrations when producing diene-functional butyl rubbers (e.g., isobutene-isoprene copolymer) is substantially eliminated in accordance with the present process with para-methylstyrene as the functional comonomer. In any event, typical examples of the diluents which may be used alone or in admixture include propane, butane, pentane, cyclopentane, hexane, toluene, heptane, isooctane, etc., and various halohydrocarbon solvents which are particularly advantageous herein, including methylene chloride, chloroform, carbon tetrachloride, methyl chloride, with methyl chloride being particularly preferred.

It should also be noted that, with any particular monomers (for example, isobutene and para-methylstyrene), as the compositional distribution of the feed is altered therebetween, in order to maintain either a slurry or solution polymerization it can be necessary to change the diluents employed, depending upon the effect on the solubility of the copolymer in the diluent as the ratio of the monomers utilized therein is altered. In any event, as noted above, an important element in making the copolymer precursor of the present invention is the exclusion of impurities from the polymerization reactor, namely impurities which, if present, will result in complexing with the catalyst or copolymerization with the isoolefin or the para-alkylstyrene, which, in turn, will prevent one from obtaining the molecular weight properties necessary for making the pre-functionalized copolymer reactant and obtaining improved physical properties of the PSA or coating product of this invention. Instead, polymers which do not have the substantially homogeneous compositional distributions and/or narrow molecular weight distributions of the present invention, will be produced.

Most particularly, these impurities include catalyst poisoning materials, moisture, and other copolymerizable monomers, such as, for example, meta-alkylstyrenes and the like. These impurities should be kept out of the system so that, in turn, the para-alkylstyrene is at least about 95.0 percent by weight pure, preferably at least about 97.5 percent by weight pure, and the isoolefin is at least about 99.5 percent by weight pure, and preferably at least about 99.8 percent by weight pure. The diluents employed therein should be at least about 99.0 percent by weight pure, and preferably at least about 99.8 percent by weight pure.

In general, the polymerization reactions are carried out by admixing the para-methylstyrene and isobutene in the presence of the catalyst (such as a Lewis acid catalyst) and diluent in a copolymerization reactor, with thorough mixing, and under copolymerization conditions, including temperatures less than about 0° C., in the case of lower molecular weight polymers, and providing a means of removing the heat of polymerization in order to maintain a desired reactor temperature. In particular, the polymerization may be carried out under batch conditions of cationic polymerization, such as in an inert gas atmosphere and the substantial absence of moisture. Preferably, the polymerization is carried out continuously in a typical continuous polymerization process using a baffled tank-type reactor fitted with an efficient agitation means, such as a turbo-mixer or propeller, and draft-tube, external cooling jacket and internal cooling coils or other means of removing the heat of polymerization, inlet pipes for monomers, catalysts and diluents, temperature sensing means and an effluent overflow to a holding drum or quench tank. The reactor must be purged of air and moisture and charged with dry, purified solvent or a mixture of solvents prior to introducing monomers and catalyst.

Reactors which are typically used in butyl rubber polymerizations are generally suitable for use in the polymerization reactions of the present invention copolymer intermediate. These reactors are basically large heat exchangers in which the reactor contents are rapidly circulated through rows of heat exchange tubes which are surrounded by boiling ethylene so as to remove the heat of polymerization, and then through a central draft tube by means of an efficient marine-type impeller. Catalyst and monomers are introduced continuously into the reactor and mixed by the pump, and reactor effluent then overflows into a steam-heated flash tank. Heat of polymerization can also be removed by a pump-around loop in which the reactor contents are continuously circulated through an external heat exchanger in the loop.

When conducting a slurry polymerization process, the reactor is generally maintained at temperatures of from about −85° C. to about −115° C., and preferably from about −89° C. to about −96° C. Solution polymerizations and cement suspension polymerizations can be run at much warmer temperatures, such as about −40° C., depending on the copolymer molecular weight desired and the particular catalyst system used. Therefore, an acceptable solution polymerization temperature range is from about −35° C. to about −100° C., and preferably from about −40° C. to about −80° C.

The overall residence time can vary, depending upon, e.g., catalyst activity and concentration, monomer concentration, reaction temperature, and desired molecular weight, and generally will be from about one minute to about five hours, and preferably from about 10 to about 60 minutes.

Since the reactor gradually fouls with polymer in the slurry polymerization process, however, it generally becomes necessary to periodically remove the reactor from production for cleaning. It is thus most important that the fouling polymer be soluble, so that the reactor can be cleaned by solvent washing and then returned to service. Any deposition of insoluble gel polymer in the reactor would be unacceptable, since it would render solvent washing ineffective, and necessitate the use of elaborate and expensive reactor cleaning procedures. This necessity to avoid the deposition of a polymer gel in the reactor is typically one of the limitations on the amount of diene which can be used in making butyl rubbers (e.g., isobutylene-isoprene copolymer).

The para-methylstyrene/isobutene copolymers of this invention also afford significant advantages when produced using a solution polymerization process. Since para-methylstyrene does not cause the severe molecular weight depression characteristic of dienes, and since the molecular weight versus polymerization temperature response of these new copolymers is much flatter than with diene functional butyl copolymers, high molecular weight copolymers can be made at much warmer temperatures (i.e., about −40° C. versus less than about −90° C. with the diene functional butyl copolymers). These warmer polymerization temperatures translate into a much lower viscosity at any given polymer concentration and molecular weight. In particular, it is now possible to conduct these solution polymerizations at temperatures of from about −35° C. to about −100° C., and preferably from about −40° C. to about −80° C. When producing the low molecular weight polymers of this invention, for example, $M_n$ of less than 25,000, temperatures as warm as 0° C. can be used, or even up to about +10° C. for very low molecular weight polymers with $M_n$ in the range of about 500 to 1,000. Furthermore, the para-methylstyrene/isobutene copolymers have a much narrower molecular weight distribution than do the diene functional butyl rubbers, and this also results in a much lower solution viscosity at a given number average molecular weight.

Solution polymerization has the further advantage, particularly with the para-methylstyrene/isobutene copolymers of this invention, in that the precursor copolymers are produced in a desirable solution state in which post-polymerization chemical modification can be conducted. It is also possible to halogenate and graft nucleophile moieties onto the precursor polymer in the bulk state (i.e., using an internal mixer, extruder, etc.), but most reactions can be more easily performed in a more controlled manner on polymer solutions, which afford better mixing, heat transfer, removal of unwanted by-products, etc.

The polymerization processes can also be carried out in the form of a so-called "cement suspension" polymerization process. In particular, these are polymerization reactions carried out in a selected diluent such that the polymer is only slightly soluble in the diluent, and the diluent is sufficiently soluble in the polymer so that a second phase is formed which contains substantially all of the polymer, but wherein the continuous phase or diluent phase has a sufficiently low viscosity so that the second or polymer-rich phase can be dispersed therein. In one form of these cement suspension polymerizations, they are carried out in such a diluent whose lower critical solution temperature for the polymer to be prepared is below the temperature at which the reaction is to be carried out. The lower critical solution temperature, in turn, is defined as the temperature above which the polymer is no longer soluble in a solvent. In addition, in accordance with these processes, it would be appreciated that as the temperature of a solution of polymer and diluent is increased, a temperature will be reached above which the polymer is no longer soluble. If maintained at this temperature, separation of two phases will occur with generally the lower portion being a heavier polymer-rich phase and the upper portion being a lighter solvent-rich phase. This phenomenon can thus be utilized to separate polymers from solution in conventional solution polymerization processes as discussed above. In any event, to achieve the desirable two-phase "cement suspension" it is necessary that the light phase be a very poor solvent for the polymer to maintain low viscosity, and that the polymer-rich heavy phase separate out and contain enough solvent so it behaves as a liquid and can be dispersed in the light phase. The particular details of such cement suspension processes are set forth in U.S. Pat. No. 3,932,371, and the description of same is hereby incorporated herein by reference thereto.

2. Malogenated Base Terpolymer Preparation

An example of a post-polymerization chemical modification reaction that can be run on bulk recovered polymer, and can also be run on polymer solution produced in a solution polymerization process (after suitable quenching and removal of residual monomers) is halogenation (e.g., radical bromination) to produce the very versatile benzylic halogen-functional copolymer ingredients described herein. The surprising ease and highly selective nature of radical halogenation to introduce a benzylic halogen, and the great versatility of the benzylic halogen, makes this a most preferred modification reaction.

Functionality-introducing reactions such as halogenation are carried out on the precursor para-methylstyrene/isobutene copolymers produced by any of the above polymerization methods in a separate post-polymerization step, with direct halogenation, and most preferably radical halogenation, being the preferred reaction. It is generally desirable to treat the precursor polymerizaton copolymer product in an appropriate manner, prior to such halogenation, in order to quench the catalyst and/or remove catalyst residues, remove residual unconverted monomers, and put it into a convenient form for the halogenation reaction.

It is nearly always desirable to quench the catalyst in the reactor effluent in order to prevent continued polymerization, with the concomitant production of low molecular weight ends and/or to prevent degradation and crosslinking reactions from occurring as the effluent is warmed. This quenching can be accomplished in a conventional manner. Generally speaking, with the aluminum-based catalysts usually employed in making the copolymers of this invention and with the high catalyst efficiencies achieved, a separate catalyst residue removal step is not required, but much of this residue is extracted into the water phase in conjunction with conventional water-based finishing processes anyway.

Residual unconverted monomers left in the precursor copolymer will react during halogenation to both consume halogen and produce generally undesirable by-products, and their presence thus renders it difficult to control and measure the amount of desired functionality introduced into the copolymer. Hence, except in cases where the copolymer has been polymerized at very high conversion, it is usually necessary to remove these residual monomers. Unreacted isobutene is volatile enough to be easily removed in any of a variety of stripping operations, but para-methylstyrene, with its high boiling point of 170° C., is much more difficult to remove. It is therefore advantageous to polymerize at very high para-methylstyrene conversion levels so that its removal and/or recycle becomes unnecessary or, at least involves smaller amounts of material.

The halogenation reaction itself can be carried out in the bulk phase or on the precursor copolymer either in solution or in a finely dispersed slurry. Bulk halogenation can be effected in an extruder, or other internal mixer, suitably configured to provide adequate mixing and for handling the halogen and corrosive by-products of the reaction. Bulk halogenation in an extruder has the advantages of permitting complete removal of residual unreacted para-methylstyrene by conventional finishing operations prior to halogenation, and of avoiding possible diluent halogenation as an undesired side reaction. It has the disadvantages of requiring a much more expensive and high powered reactor (i.e., extruder) than is required for solution halogenation, and of providing poorer mixing, thermal control, etc., than can be achieved in solution, so that the halogenation reaction is conducted under less homogeneous, more difficult to control conditions. The details of such bulk halogenation processes are set forth in U.S. Pat. No. 4,548,995, which is hereby incorporated herein by reference thereto.

Solution halogenation is advantageous in that it permits good mixing and control of halogenation conditions to be achieved, easier removal of undesired halogenation by-products, and a wider range of initiators of halogenation to be employed. Its disadvantages include the need for removal of residual unreacted para-methylstyrene prior to halogenation, the presence of complicating side reactions involving solvent halogenation, and a solution step if a non-solution polymerization process is used to prepare the copolymer, as well as removal, clean-up and recycle of the solvent. Suitable solvents for such halogenation include the low boiling hydrocarbons ($C_4$ to $C_7$) and halogenated hydrocarbons. The halogenation can also be conducted with the copolymer as a fine slurry or cement suspension in a suitable diluent which is a poor solvent for the copolymer. This is advantageous from a viscosity viewpoint and allows high solids content during halogenation, but it requires that the slurry or suspension be stable with little tendency to agglomerate or plate out on reactor surfaces. Since the high-boiling point para-methylstyrene makes its removal by conventional distillation impractical, and since it is difficult to completely avoid solvent halogenation, it is very important where solution or slurry halogenation is to be used that the diluent and halogenation conditions be chosen to avoid diluent halogenation, and that residual para-methylstyrene has been reduced to an acceptable level.

Halogenation of the precursor para-methylstyrene/isobutene copolymer intermediates is significantly different from halogenation of isobutene-isoprene (butyl) rubbers because the primary reactive site for halogenation is entirely different. The para-methylstyrene/isobutene copolymers contain no in-chain (backbone) olefinic unsaturation contribution from the para-methylstyrene, and the primary reactive halogenation site is thus the enchained para-methylstyrene moiety, which is far less reactive than the olefinic site in butyl rubber. Under typical butyl rubber halogenation conditions (e.g., dark, non-catalyzed reactions, in a hydrocarbon solvent, at low temperature (such as less than about +80° C.) and for short contact times (such as less than about 10 minutes)) no detectable halogenation of the para-methylstyrene copolymer even occurs. Furthermore, while it is possible to chlorinate para-methylstyrene copolymers in a polar diluent, the chlorinated species produced are entirely different than in the case of isobutylene-isoprene (butyl) rubber. Such chlorinated species include chlorine on the aromatic ring, and on the polymer backbone, as well as the preferred primary benzylic chlorination, in contrast to the chlorination of the olefinic sites in the prior art copolymers.

With halogenation of para-methylstyrene/isobutene copolymers, it is possible to halogenate the ring carbons, but the products are rather inert and of little interest. It has surprisingly been found, however, that it is possible to introduce this desired functionality into the para-methylstyrene/isobutene copolymers hereof in high yields and under practical conditions without obtaining excessive polymer breakdown, crosslinking or other undesirable side reactions.

When halogenation of the para-methylstyrene/isobutene copolymers hereof is carried out without using the specified selected reaction conditions, catalysts, reagents and initiators hereof, it tends to either not occur at all, or to proceed by various routes, so as to produce a variety of halogenated products. Thus, if chlorine or bromine is added to a solution of para-methylstyrene/isobutene copolymer in a low dielectric constant hydrocarbon solvent, such as hexane or cyclohexane, in the dark at 30°–60° C. for about five minutes, essentially no reaction occurs. On the other hand, if the chlorination reaction is run in a more polar (higher dielectric constant) diluent, such as methylene chloride, then chlorination does occur, but apparently by many different routes, so that a variety of different chlorinated products are produced thereby. These include some of the highly desirable primary benzylic chlorine resulting from substitution on the ring methyl group, but a major amount of less desirable chlorinated products.

It is known in connection with the halogenation of small molecules that the side chain halogenation of alkyl-substituted benzenes, as opposed to nuclear substitution, is favored by radical instead of ionic conditions. This might therefore be said to suggest that such radical conditions, including the avoidance of Friedel-Crafts catalysts (or metallic halogenation catalysts in general), the avoidance of polar diluents, and the use of photochemical, thermal, or other radical initiators, would be preferred for the selective halogenation of the copolymers hereof. However, it is also known that the halogenation of polymers does not necessarily follow the same routes as that of these small molecules, particularly since even minor side reactions can be extremely significant. Furthermore, it is known that, in radical halogenation, with concurrent hydrogen replacement, tertiary hydrogens are more easily replaced than are secondary hydrogens, which are more easily replaced than the primary benzylic hydrogens on the enchained para-methyl/styryl moiety in the copolymers hereof.

It has rather surprisingly been found, however, that radical bromination of the enchained para-methyl styryl moiety in the copolymer ingredients of this invention can be made highly specific with almost exclusive substitution occurring on the para-methyl group, to yield the desired benzylic bromine functionality. The high specificity of the bromination reaction can thus be maintained over a broad range of reaction conditions, provided, however, that factors which would promote the ionic reaction route are avoided (i.e., polar diluents, Friedel-Crafts catalysts, etc.).

Thus, solutions of the precursor para-methylstyrene/isobutene copolymer intermediates of this invention in hydrocarbon solvents such as pentane, hexane or heptane can be selectively brominated using light, heat or selected radical initiators (according to conditions, i.e., a particular radical initiator must be selected which has an appropriate half-life for the particular temperature conditions being utilized, with generally longer half-lives preferred at warmer halogenation temperatures) as promoters of radical halogenation, to yield almost exclusively the desired benzylic bromine functionality, via substitution on the para-methyl group, and without appreciable chain scission and/or crosslinking. Without wishing to be bound by any theory, it is believed that the bromination reaction proceeds by means of a rapid radical chain reaction with the chain carrier being, alternatively, a bromine atom and a benzylic radical resulting from hydrogen atom abstraction from a para-methyl group on the enchained para-methylstyryl moiety. The proposed mechanism thus involves the following steps:

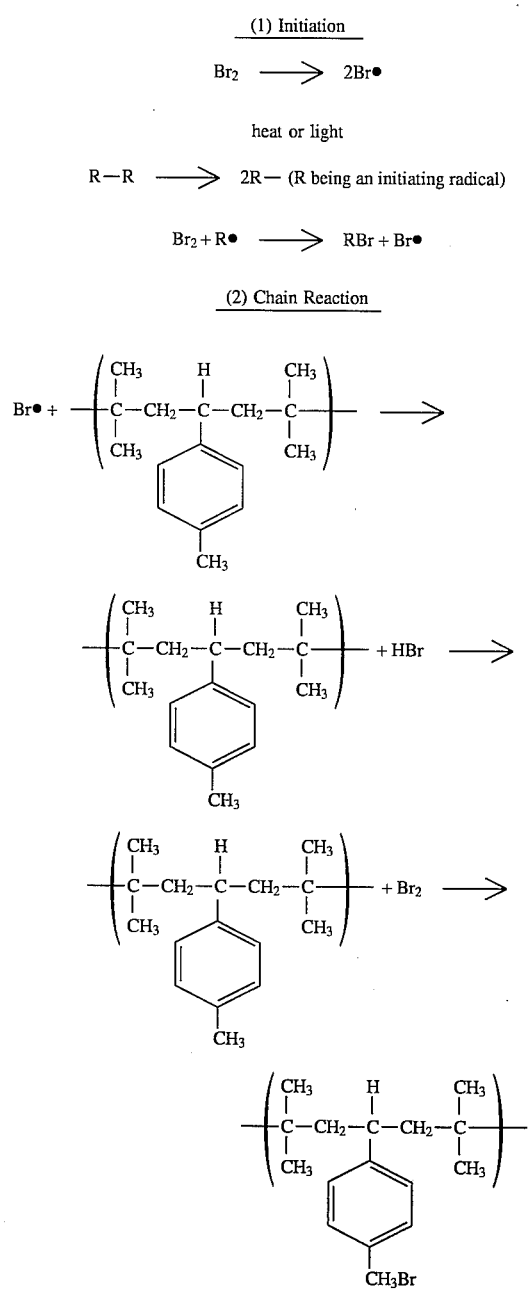

The reaction terminates when one of the radicals reacts with some radical trap in the system, or the radicals destroy themselves by recombination or disproportionation.

This reaction can be initiated as shown in step (1) above by formation of bromine radicals, either photochemically or thermally (with or without the use of $CH_3$ sensitizers), or the radical initiator used can be one which preferentially reacts with a bromine molecule rather than one which reacts indiscriminately with bromine radicals, or with the solvent or polymer (i.e., via hydrogen abstraction). The sensitizers referred to are those photochemical sensitizers which will themselves absorb lower energy photons and dissociate, thus causing, in turn, dissociation of the bromine, including materials such as iodine. It is thus preferred to utilize an initiator which has a half life of from about 0.5 to about 2500 minutes under the desired reaction conditions, more preferably from about 10 to about 300 minutes. The amount of initiator employed will usually vary from about 0.02 to about 0.3 percent by weight. The preferred initiators are bis azo compounds, such as azobisisobutyronitrile, azobis(2,4-dimethylvaleryl)nitrile, azobis (2-methylbutyro)nitrile, and the like. Other radical initiators can also be used, but it is preferred to use a radical initiator which is relatively poor at hydrogen abstraction, so that it reacts preferentially with the bromine molecules to form bromine radicals rather than with the precursor copolymer or solvent to form alkyl radicals. In those cases, there would then tend to be resultant copolymer molecular weight loss, and promotion of undesirable side reactions, such as crosslinking.

The radical bromination reaction of this invention is highly selective, and almost exclusively produces the desired benzylic bromine functionality. Indeed, the only major side reaction which appears to occur is disubstitution at the para-methyl group, to yield the dibromo derivative, but even this does not occur until more than about 60 percent of the enchained para-methylstyryl moieties have been monosubstituted. Hence, any desired amount of benzylic bromine functionality in the monobromo form can be introduced into the copolymers of this invention, up to about 60 mole percent of the para-methylstyrene content. Furthermore, since the para-methylstyrene content can be varied over a wide range as described herein, it is possible to therefore introduce a significant functionality range. The halogenated copolymer ingredients of this invention are thus highly useful in subsequent reactions, for example, crosslinking reactions. Once the bromide leaving group is incorporated, the copolymer can be functionalized with a radiation-sensitive nucleophile compound.

It is desirable that the termination reactions discussed above be minimized during bromination, so that long, rapid radical chain reactions occur, and so that many benzylic bromines are introduced for each initiation, with a minimum of the side reactions resulting from termination. Hence, system purity is important, and steady-state radical concentrations must be kept low enough to avoid extensive recombination and possible cross-linking. The reaction must also be quenched once the bromine is consumed, so that continued radical production with resultant secondary reactions (in the absence of bromine) do not then occur. Quenching may be accomplished by cooling, turning off the light source, adding dilute caustic, the addition of a radical trap, or combinations thereof.

Since one mole of HBr is produced for each mole of bromine reacted with or substituted on the enchained para-methylstyryl moiety, it is also desirable to neutralize or otherwise remove this HBr during the reaction, or at least during polymer recovery in order to prevent it from becoming involved in or catalyzing undesirable side reactions. Such neutralization and removal can be accomplished with a post-reaction caustic wash, generally using a molar excess of caustic on the HBr. Alternatively, neutralization can be accomplished by having a particulate base (which is relatively non-reactive with bromine) such as calcium carbonate powder present in dispersed form during the bromination reaction to absorb the HBr as it is produced. Removal of the HBr can also be accomplished by stripping with an inert gas (e.g., $N_2$) preferably at elevated temperatures.

The brominated, quenched, and neutralized para-methylstyrene/isobutene copolymers, "base terpolymer" of this invention can be recovered and finished using conventional means with appropriate stabilizers being added to yield highly desirable and versatile leaving group functionalized saturated copolymers which are useful in the nucleophilic substitution reactions which follow to incorporate UV- or other radiation-reactive functionality.

In particular, since little if any tertiary benzylic bromine is produced in the copolymer molecule, the potential dehydrohalogenation reaction will be almost entirely eliminated therein. This results in a halogenated polymer of improved stability. In addition, presence of the bromine on the ring-methyl group leads to several additional significant advantages with respect to this product. It permits functionalization by substitution of other functional groups at that site.

3. Nucleophilic Substitution of the Base Terpolymer

The benzylic bromine (halogen) functionality is uniquely suited, as the base from which the versatile functionalized saturated copolymers employed in the lithographic or corrosion resistant coating compositions of this invention can be prepared, because it can be made to undergo selective nucleophilic substitution reactions with a great range of nucleophiles, so that almost any desired type and amount of functionality can be introduced without undesirable side reactions and under conditions which are mild enough to avoid degradation and/or crosslinking of the saturated copolymer backbone containing the pendant benzylic halogen functionality. Furthermore, in many instances, it is possible to only partially convert the pendant benzylic halogen to another desired functionality while retaining some, or to later convert another portion, of the remaining benzylic halogen functionality to yet another new functionality, so that copolymers containing mixed functionalities can be made. The mixed functionality can advantageously provide unique combinations of properties, such as grafting with another functional polymer via one of the functionalities and then cross-linking or adhering to some surface via another of the functionalities.

One of the attributes of the benzylic halogen functionality of the radically halogenated isobutylene/para-methylstyrene copolymers which makes them an ideal base copolymer from which to prepare the various radiation-reactive functionalized saturated copolymers is the wide range of nucleophilic substitution reactions this benzylic halogen functionality will undergo and the relatively mild conditions under which these nucleophilic substitution reactions will proceed, A benzylic halogen functionality constitutes a very active electrophile which will react under suitable conditions with any nucleophile capable of donating electrons to it. Suitable nucleophiles include those containing oxygen, sulfur, nitrogen, phosphorus, carbon, silicon, and various metals including especially magnesium, lithium, sodium, and potassium. Suitable UV-reactive nucleophiles include, for example, UV-reactive carboxylate esters, dithiocarbamate esters, and the like. Equally important to this versatility in types of nucleophiles which will react with the benzylic halogen functionality is the relatively mild conditions under which these nucleophilic substitution reactions proceed so that substitution reactions can be completed to introduce the desired new functionality without cleavage or crosslinking reactions involving the saturated hydrocarbon backbone of the isobutylene/para-methylstyrene copolymer.

Another of the attributes of the benzylic halogen functionality is the selectivity with which the desired substitution reactions can be made to proceed without undesirable side reactions. The benzylic halogen functionality will undergo clean substitution reactions without complicating elimination reactions. This attribute is extremely important in reactions involving soluble high polymers, since even a tiny amount of a side reaction which can lead to coupling may lead to gelation. In reactions involving simple molecules (which are usually mono-functional) yields of only 70 percent of the desired product may be acceptable, since purification and separation of the undesired products is relatively simple. In reactions involving already cross-linked polymers (e.g. "Styragels") lower yields to the desired product may also be acceptable, since the starting polymer is already insoluble. However, in reactions with the soluble high polymers of this invention which contain many functional groups per molecule, it is necessary to achieve >99 percent of the desired substitution reaction in order to maintain solubility during reaction and recovery. Tiny, almost insignificant (in other reactions) amounts of side reactions which produce gel may interfere with usefulness. Furthermore, purification of the substituted polymer to remove unwanted side products is usually very difficult or impossible. This is why the selective s ingle route to high yield nucleophilic substitution reactions achievable with benzylic halogen functionality under controlled conditions is important. By using isobutylene/para-methylstyrene/para-bromomethylstyrene terpolymers as a "base" polymer for modification, and by conducting nucleophilic substitution reactions under appropriate and controlled conditions, soluble, backbone-saturated copolymers containing useful pendant functionality have been prepared. Examples include:

(1) Esters (many containing other function groups such as acetate, stearate linoleate, eleostearate, cinnamate, etc.;

(2) Hydroxyl (attached directly in place of the benzylic bromine or attached via another linkage);

(3) Carboxy;

(4) Nitrile;

(5) Quaternary ammonium salts;

(6) Quaternary phosphonium salts;

(7) S-Isothiuronium salts;

(8) Dithiocarboxylate esters;

(9) Mercaptans;

(10) Carboxylate esters and phenolates which contain radiation-reactive functional groups exemplified by benzoylbenzoate, cinnamate, tung oil fatty acid esters, and anthraquinone-2-carboxylate; and

(11) UV-reactive dithiocarbamate esters.

While every reactive derivative, in general, and radiation-reactive derivative specifically, that could be prepared by nucleophilic substitution reactions on the isobutylene/para-methylstyrene/ para-bromomethylstyrene terpolymers has not been prepared, it is obvious that one skilled in the art could attach almost any desired pendant functionality including those having radiation reactivity and mixtures of functionalities as desired for various applications, by applying the principles disclosed herein. The attachment of two or more different types of functional groups allows preparation of polymers which can be radiation crosslinked, emulsified, and/or possess improved adhesion to specific substrates as each of these attributes can be derived from the judicious choice of an appropriate functionality.

The "key" requirements for producing the versatile, pendant radiation sensitive backbone saturated, soluble copolymers of this inventions via selective nucleophilic substitution reactions are:

(1) Use of the isobutylene/para-halomethylstyrene/para-methylstyrene base terpolymers for nucleophilic substitutions under appropriate, controlled conditions. The composition of the terpolymer can be varied as desired to yield the desired combination of properties (i.e. $T_g$, hardness, flexibility, impact strength, functionality level, etc.).

(2) Choosing the nucleophile and reaction medium so as to achieve the required intimate contact between the benzylic halogen attached to the base terpolymer and the nucleophile. It should be recognized that in some instances this can be accomplished by using a different solvent or reaction medium for the polymer and for the nucleophile and then employing an appropriate phase transfer catalyst to promote the reaction.

(3) Achieving specific solvation at the reaction site so that the desired nucleophilic substitution reaction is facilitated at mild conditions.

(4) Avoiding "vigorous" or "harsh" reactants or reaction conditions such as strong "hard" bases or high temperatures that would cause a loss in reaction specificity and allow side reactions to become important and/or cause crosslinking or degradation reactions to occur.

(5) Choosing the nucleophilic reagent and promoters appropriately so that the desired substitution reaction occurs quickly under mild conditions and potential undesired side reactions are avoided. For example, in using a carboxylic nucleophile in an esterification reaction to replace the benzylic bromines on an isobutylene/para-methylstyrene/para-bromomethylstyrene base terpolymer, one could choose the potassium salt of the acid as the nucleophilic reagent, along with 18 Crown-6 to solvate the potassium ion and promote the desired esterification substitution reaction, or one could choose the tetrabutylammonium counterion in an appropriate solvent as a nice "soft" acid to promote the reaction, rather than trying to use a "hard" ionic salt of the carboxylic acid as the nucleophilic reagent.

(6) Choosing reaction conditions to minimize sequential reactions by recognizing that the nucleophilic substitution reaction being conducted can itself form attached pendant nucleophilic reagents on the base copolymer backbone and that these already attached nucleophilic reagents can nucleophilically "attack" other unreacted benzylic bromines on the base terpolymer in a sequential manner to consume the desired, already attached new functionality, and at the same time produce undesirable crosslinking and gelation.

Thus, reaction conditions must be chosen such that the unreacted nucleophilic reagent being used in the nucleophilic substitution reaction is either a much stronger, more reactive nucleophile, or is present in great excess over any attached nucleophilic functionality produced in the substitution reaction. For example, it must be recognized that attached basic groups will become available nucleophiles under basic conditions for further reaction with benzylic bromine. These intrapolymeric groups can react with other benzylic bromines to consume the already attached pendant functionality and produce undesired crosslinks. The result is gelled polymer instead of the desired pendant functionalized polymer of the invention. Attempting to replace the benzylic bromines of the base terpolymer of this invention with mercaptan groups, it must be recognized that the attached SH (mercaptan) groups will form incorporated mercaptide nucleophilic reagents under basic conditions and these incorporated mercaptide groups will react with other benzylic bromines to consume the already incorporated pendant mercaptan functionality and produce undesired thioether crosslinks resulting in gelled polymer instead of the desired pendant functionalized polymer of the invention.

Likewise, in producing a pendant hydroxy functionalized polymer of this invention, it must be recognized that the attached hydroxy groups will form alkoxide nucleophilic reagents under strongly basic conditions, and these attached alkoxide groups can react in a sequential manner with other unreacted benzylic bromines of the base terpolymer to consume the already attached pendant hydroxy functionality to produce ether crosslinks, resulting in gelled polymer rather than the desired pendant functionalized polymer of this invention. The key requirement of recognizing the potential for sequential reactions and choosing conditions to minimize them is especially important in cases where it is desired to produce the pendant radiation-reactive functionalized saturated polymers of this invention with mixed pendant functionality. In these mixed functionality polymers, it is extremely important to choose functionalities and conditions such that the desired pendant functionalities are preserved and sequential reactions are avoided.

The polymers of isoolefin and para-alkylstyrene-silane derivatized polymers represent another broadly useful family of materials which can be easily prepared by nucleophilic displacement through the use of suitable nucleophilic silane reagents like (N,N-dimethyl-3-aminopropyl) silanes, as depicted below:

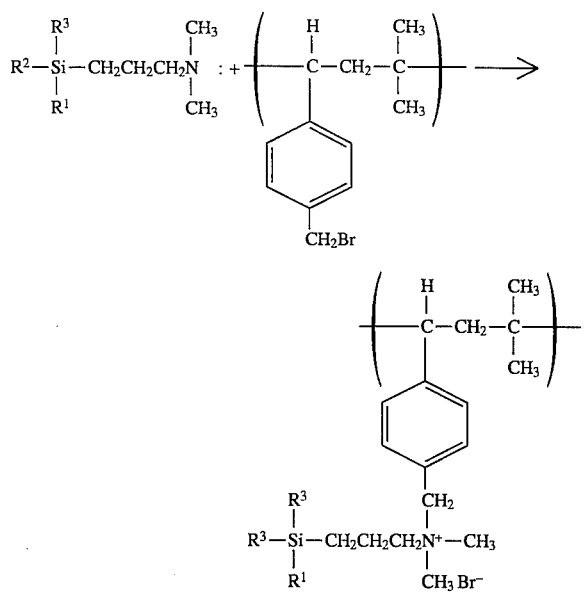

Wherein $R^1$, $R^2$ and $R^3$ are each independently selected from the group consisting of hydrogen, chloro and alkoxy having from 1 to about 5 carbon atoms such as methoxy, ethoxy, etc. The reactivity of these derivatives can be varied based upon the number and type of silane species present.

The polymers of isoolefin and para-alkylstyrene containing Si—Cl bonds are the most reactive toward a variety of nucleophiles, including a nucleophile as weak as water. Thus, these materials are vulcanizable by exposure to the atmosphere and are therefore very useful as room temperature vulcanizable compositions (RTVs).

Likewise, these polymers containing Si—O(alkyl) bonds are also reactive with a variety of nucleophiles (though not as reactive as Si—Cl) which also include water. Again this reactivity can be exploited in RTV applications, especially where the emission of neutral species during curing is preferred. Appropriate applications for this silane chemistry include sealants and adhesives where the silane functional group allows for crosslinking and improves adhesion to substrates such as glass.

Uniquely reactive are the polymers of isoolefin and para-alkylstyrene-silane derivatives which contain Si—H They undergo three fundamental types of bonds. reactions. They can react with hydroxyl- or silanol-functionalized materials in the presence of tin octoate, zinc octoate and other metal salts to form bonds with the evolution of hydrogen. This reaction can be used to impart hydrophobicity to glass, leather, paper or fabric surfaces.

The Si—H functionality will react with olefins in the presence of certain free radical or precious metal catalysts. This reaction opens the opportunity for addition cure (RTV) or low temperature vulcanization. Mixtures of these polymers with another olefin containing polymer like polybutadiene or vinyl functional silicones will rapidly yield a intermolecular crosslinked system of the polymers of isoolefin and para-alkylstyrene and the other polymer. The polymers of isoolefin and para-alkylstyrene-vinyl silicone system will provide a useful thermally stable crosslink system which exhibits improved permeability properties over existing silicone systems.

The third useful reaction for these Si—H polymers of isoolefin and para-alkylstyrene derivatives is as polymeric reducing agents. Si—H compounds are known to be active mild selective reducing agents for nitroaromatics, acid chlorides, aldehydes and ketones. Binding these reagents to polymers offers the advantage of ease of separation; the polymer is easy to remove from the low molecular weight reduced species and no hydrolysis of the remaining reagent is necessary prior to isolation. Another advantage is that these reductions can be run in the presence of air and moisture in a wide range of solvent systems including hexane, methylene chloride and dioxane.

The novel versatile, pendant functionalized, backbone saturated, soluble copolymers of this invention which are derived via selective nucleophilic substitution reactions on a base terpolymer comprising isobutylene/para-methylstyrene and para-bromomethylstyrene are widely useful as will be further disclosed in the examples dealing with specific pendant functionalities. They encompass a broad range in properties ranging from low $T_g$ elastomers high in isobutylene to high $T_g$ plastics high in para-methylstyrene with tough high impact compositions at intermediate isobutylene contents. The presence of appropriate pendant functionality renders this entire range of products "paintable" for use in external automotive or appliance applications, etc. and enables them to be adhered to and used as coatings on other substrates especially in exterior applications where the excellent environmental resistance of the backbone saturated copolymers is advantageous. The presence of appropriate pendant functionality also enables these compositions to react with or be coreacted with other functional polymers, or fillers, or fibers to form composite structures (i.e. laminates, dispersions, etc.) with desirable combinations of properties.

In accordance with this invention it has been found that the novel, pendant, radiation-reactive functionalized, saturated copolymers described and exemplified herein can be conveniently and practically produced by first preparing a base terpolymer comprising a saturated hydrocarbon backbone with one or more pendant attached electrophilic moieties, and then attaching the desired new radiation-reactive functionality via a selective nucleophilic substitution reaction with the pendant attached electrophilic moieties. It has been found to be desirable, and is important in obtaining the pendant functionalized copolymer ingredient of this invention, that the pendant attached electrophilic moieties which are replaced by other functionalities via selective nucleophilic substitution reactions be benzylic halogen moieties. These pendant attached electrophilic benzylic halogen moieties can be readily inserted into random isobutylene/para-methylstyrene copolymers by radical halogenation as mentioned previously to yield the base terpolymer containing isobutylene/para-methylstyrene/and brominated para-methylstyrene securing random units. This base terpolymer containing electrophilic benzylic halogen moieties is the "parent" polymer from which the novel, pendant functionalized, saturated copolymers of this invention are prepared via selective nucleophilic substitution reactions.

These novel pendant functionalized polymers of this invention are comprised of the following "mer" units:

a) enchained isobutylene unit

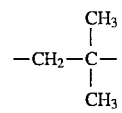

b) enchained brominated p-alkylstyrene unit

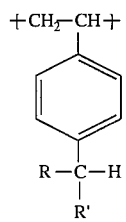

c) enchained brominated p-alkylstyrene unit
(the electrophilic unit)

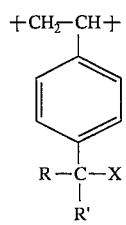

d) enchained pendent radiation-reactive
functional group formed via nucleophilic
substitution on benzylic halogen

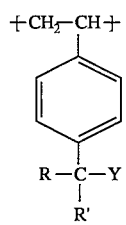

e) enchained pendent non-radiation-reactive
functional group formed via nucleophilic
substitution on benzylic halogen

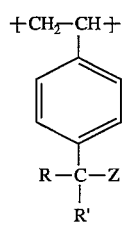

wherein: R and R' are independantly selected from the group consisting of hydrogen, alkyl, and primary or secondary alkyl halide, X is a halogen atom (preferably bromine or chlorine, and most preferably bromine), Y represents a new radiation-reactive group attached to the polymer via nucleophilic substitution of one of the benzylic halogens so that an enchained c "mer" unit has become a d "mer" unit, and Z represents a new non-radiation-reactive group attached to the polymer via nucleophilic substitution of one of the benzylic halogens so that an enchained c "mer" unit has become an e "mer" unit. Actually, there can be several different Y and/or Z species in the same polymer in cases where mixed functionalities are being introduced. Y and Z are the residues which become attached to the polymer enchained c "mer" unit in place of halogen when a nucleophilic reagent capable of donating electrons to benzyl halides is reacted with the base terpolymer in accordance with this invention.

The four (or more if several different Y and/or Z functionalities are present) "met" units are attached to one another in random fashion to form the novel, pendant radiation-reactive functionalized, backbone saturated polymer ingredients in the compositions of this invention. Total polymer number average molecular weight can range from <500 to >100,000. The amounts of the various "mer" can range as follows:

a) (isobutylene)—"mer" units from about 10 to about 99.5 weight percent;

b) (p-alkylstyrene)—"mer" units from about 0.5 to about 90 weight percent;

c) (radically brominated p-alkylstyrene)—"mer" units from 0 to about 55 weight percent;

d) (pendant radiation reactive functional p-alkylstyrene)—"mer" units from about 0.5 to about 55 weight percent;

e) (pendant non-radiation-reactive functional p-alkylstyrene)—"mer" units from 0 to about 55 weight percent.

Actually, there can be several different Y and/or Z species in the same polymer in cases where mixed functionalities are being introduced. Y and optionally Z are the residues which become attached to the polymer unit in place of halogen when a nucleophilic reagent capable of donating electrons to benzyl halides is reacted with the base terpolymer in accordance with this invention, wherein a) is from about 10 to about 99.5 percent by weight, more preferably from about 80 to about 99 percent by weight, and most preferably from about 90 to about 98 percent by weight, b) is from about 0.5 to about 90.0 percent by weight, more preferably from about 1 to about 20 percent by weight, and most preferably from about 2 to about 10 percent by weight, d) is from about 0.5 to about 55.0 weight percent by weight, more preferably from about 0.5 to about 20 percent by weight and most preferably from about 0.5 to about 15 mole percent, c) is from 0 to about 55.0 percent by weight of the para-alkylstyrne, more preferably from 0 to about 20 percent by weight, and most preferably from 0 to about 15 percent by weight and e) is from 0 to about 55.0 percent by weight, more preferably from 0 to about 20 percent by weight, and most preferably from 0 to about 15 percent by weight. The number average molecular weight of the functionalized polymers is from about 5000 to about 500,000, more preferably from about 50,000 to about 300,000 and most preferably from about 50,000 to about 150,000.

In accordance with an embodiment of the present invention, the nucleophilic reagents which are capable of donating electrons to benzyl halides and to displace a halide ion via a substitution nucleophilic displacement reaction and attach the radiation-reactive functional group Y, and optionally the non-radiation-reactive functional group Z, in the benzylic position from which the halogen was displaced may be Y or YM, or Z or ZM, wherein: M is hydrogen, a metal ion, or an ammonium ion and Y and/or Z are either a simple nucleophile containing oxygen, sulfur, silicon, carbon, nitrogen, phosphorus, or various metals; or Y and/or Z are a small molecule of <1000 molecular weight which may contain other functionality in addition to the simple nucleophile which become attached at the benzylic position in the nucleophilic displacement reaction.

Examples of simple nucleophiles Containing oxygen which results in the attachment of —O— to the benzylic position from which the halide ion was displaced included, but are not limited to:

| | |
|---|---|
| ⁻OR | as in alkoxide or phenoxide |
| ⁻O\C—R // O | as in carboxylates |
| ⁼O₃S | as in sodium salts |

Examples of simple nucleophiles containing sulfur which result in attachment of —S— to the benzylic position from which the halide ion was displaced include (but are not limited to):

| | |
|---|---|
| ⁻S—R | as in thiolates and thiophenolates |
| ⁻SR₂ | as in thioethers |
| ⁻O\C—R // S | as in thiocarboxylates |
| ⁻S\C—R // S | as in dithiocarboxylates |
| S=C(NR₂)(NR₂) | as in thioureas |
| ⁻S\C—NR₂ // S | as in dithiocarbamates |
| ⁻S\C—OR₂ // S | as in xanthates |
| ⁻SCN | as in thiocyanates |

Examples of simple nucleophiles containing silicon which result in the attachment of —Si— to the benzylic position from which the halide ion was displaced and n=1,2 or 3 include (but are not limited to):

| | |
|---|---|
| H—SiR₃ | as in silanes |
| H—SiXₙR₃₋ₙ | as in halosilanes |

Examples of simple nucleophiles containing carbon which result in the attachment of —C— to the benzylic position from which the halide ion was displaced included (but are not limited to):

| | |
|---|---|
| ⁻CN | as in cyanides |
| ⁻CR₃ | as in organo lithium (or other alkali or alkaline earth metals) compounds |
| HC—(R)—(CO₂R)₂ | as in malonates and di- or trisubstituted methane derivatives in general in which the substituents activate the substituents methane carbon for carbon-alkylation reactions under basic conditions. |

Examples of simple nucleophiles containing nitrogen which result in the attachment of —N— to the benzylic position from which the halide ion was displaced and n=0,1,2 or 3 (include but are not limited to):

| | |
|---|---|
| R<br>HN—C—R<br>∥<br>O | as in amides |
| NH$_n$R$_{3-n}$ | as in various amines |
| 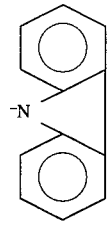 | as in carbozales |
| 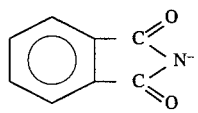 | as in phthalimides |
| 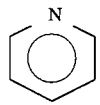 | as in pyridine |
| 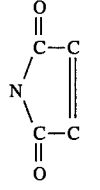 | as in maleimide |
| CH₂Z<br>/<br>HN<br>\<br>CH₂Z | where Z is some functional group as in iminodiethanol, iminodiacetonitile, diacetonitrile iminodiacetic acid, etc. |
| ⁻N=C=O | as in cyanates |

Examples of simple nucleophiles containing phosphorous which result in attachment of —P— to the benzylic position from which the halide ion was displaced and n=0,1,2 or 3 (include but are not limited to):

| | |
|---|---|
| PH$_n$R$_{3-n}$ | as in various phosphines |

Examples of simple nucleophiles containing a metal which results in the attachment of —M— to the benzylic position from which the halide ion was displaced include (but are not limited to):

| | |
|---|---|
| Mg— | (anthracene complex in THF) |
| Li— | (appropriately complexed) |

Examples in which Y and/or Z are a small molecule of <1000 molecular weight containing other functionality in addition to the simple nucleophile which becomes attached at the benzylic position from which the halide ion was displaced in the nucleophilic displaced reaction include (but are not limited to): triethanol amine, iminodiacetic acid, iminodiacetonitrile, iminodiethanol, vinyl pyridines, cinnamate, eleostearate, linoleate, acrylate, benzoyl benzoate, benzoyl phenolate, dihydroxybenzophenone, crown ethers derivatives, cryptand derivatives, cellulose derivatives, sugar derivatives, low molecular weight polyethylene oxide or polypropylene oxide chains with terminal nucleophilic groups, etc. It should be noted that these reactions in which Y and/or Z contain other functionalities in addition to the simple nucleophile which becomes attached at the benzylic position from which the halide ion was displaced greatly extend the type and range of functionalities which can be incorporated into the novel pendant functionalized, saturated copolymers of this invention, as prepared by selective nucleophilic substitution reactions. This ability to attach multifunctional Y and/or Z groups enables clusters of polar groups to be attached as is desirable in dispersants of various type (i.e. lube oil dispersants); enables functionalities that are not readily achieved by the nucleophilic displacement reaction (such as olefins or conjugated unsaturation) to be attached; and enables very complex and special functionalities such as chiral compounds or crown compounds of cryptands to be attached to produce novel pendant functionalized copolymers of this invention with unique properties for highly specialized applications such as catalysts and so forth.

However, it should also be noted that attachment of Y and/or Z groups containing other functionalities requires even greater care during the nucleophilic displacement reaction by means of which the Y and/or Z groups are attached to insure that the new functionalities are preserved and are not consumed by sequential reactions to produce unintended crosslinking or gelation. In some instances, it may be desirable to block the functionalities that need to be preserved until the nucleophilic substitution reaction is completed.

Most nucleophilic substitution reactions of this type also involve some degree of side reactions which can be extremely detrimental in making the pendant functionalized soluble copolymers of this invention, since even minor amounts of side reactions in high polymers can lead to unintended gelation which can greatly diminish utility. One advantage of using the unique base polymers of this invention for the nucleophilic substitutions reactions is that the undesired side reactions can be largely eliminated. It is known that nucleophilic substitution reactions can proceed by several different mechanisms, and with most electrophiles these different mechanisms can lead to different products or to different amounts of side reactions.

Those reactions which proceed by a concerted $S_N2$ mechanism usually yield more of the desired substitution product than those proceeding by an $S_N1$ mechanism. An advantage of using the enchained benzylic halogen of this invention as the electrophile site for nucleophilic substitution is that elimination reactions are entirely prevented so that even nucleophilic substitution reactions proceeding by an $S_N1$ mechanism still lead selectively to the desired substitution product without undesired side reactions.

A further advantage of using the preferred benzylic bromine of this invention as the site for nucleophilic substitution is that the substitution reactions proceed under mild conditions (since the benzylic bromine is so labile) so that degradation of the polymer backbone or thermal rearrangement or decomposition of the reactants or products can be avoided. Utilization of benzylic halogen, especially benzylic bromine, as the enchained electrophile site for nucleophilic substitution as in this invention also makes it possible to select reagents and conditions so that other side reactions, such as those proceeding by another mechanism or the sequential reactions can be largely eliminated so that the soluble pendant functionalized copolymers of this invention can be prepared by selective $S_N2$ nucleophilic substitution reactions. Careful observance of the six "key" requirements already outlined is necessary in order to prepare the radiation-reactive pendant functionalized backbone saturated, soluble polymers of this invention.

The exact and specific conditions suitable for preparing the various pendant radiation-reactive functionalized, soluble, saturated copolymers of this invention will vary depending upon the new functionality being introduced, as well as the base copolymer composition and other factors, and some experimentation may be necessary to define practical conditions in each case, but the same key factors as outlined herein must always be considered and observed. This will become clearer in the specific examples to follow, but some general reaction conditions can first be defined.

The nucleophilic substitution reactions can be run in solution using a solvent system in which both the base polymer and nucleophilic reagent are soluble; can be run in a two-phase liquid run system with the base polymer dissolved in one phase and the nucleophilic reagent in the other: can be run in a two-phase solid/liquid system (i.e. with the base polymer dispersed in a liquid phase containing the nucleophilic reagent); or can be run in bulk with reactants dissolved or dispersed in the base polymer. The common solution situation is most controllable and generally the preferred case, but the bulk reaction may be economically advantageous in some cases where suitable reagents and reaction conditions can be found.

The intermediate two-phase systems may be advantageous under some circumstances and may be necessary in instances where the solubility parameters of the base polymer (containing the electrophile) and the nucleophilic reagent are so different that no common solvents exist. In these two-phase cases, it is often or usually desirable to use phase transfer catalysts to promote the nucleophilic substitution reaction at the interface between the phases or to transport the nucleophilic reagent to the electrophile site in the base polymer. A most preferred way of preparing the pendant functionalized polymers of this invention is to radically halogenate a random isobutylene/para-methylstyrene copolymer, as taught previously, to introduce the benzylic halogen electrophile, and then conduct the nucleophilic substitution reaction to introduce the desired new functionality in the same medium in a sequential reaction (halogenate and then nucleophilically displace the halogen) without ever recovering the base halogenated polymer separately.

Depending upon the reactivity of the nucleophilic reagent used and the reaction conditions, the nucleophilic substitution reactions can be run at temperatures varying from about 0° C. to about 200° C. as limited by thermal stability of the nucleophilic reagent, the base polymer and the functionalized product polymer. Normally, temperatures between about 0° C. and about 150° C. are preferred. Reaction times are normally (but not necessarily) chosen to allow the nucleophilic displacement reaction to go to completion (i.e. exhaustion of either the electrophile or the nucleophilic reagent) and may range between several seconds and a few days. Normally, reaction times between a few minutes and several hours are preferred and reaction temperature and other conditions are set to make a convenient reaction time possible.

A wide range of solvents and/or solvent blends may be used as the medium in which the nucleophilic displacement reaction is run and it is this factor which determines whether a solution, dispersion, or bulk reaction is conducted. A number of factors are important in selection of the the solvents. They need to be inert under the reaction conditions, easily removed from the product, easily recycled for reuse in the process, of low toxicity under use conditions with minimum environmental health concerns, and economical to use. In addition, the solvents need to provide a reaction environment which is favorable for the reaction being run, that is, they must bring the reactants into the required intimate solution contact and should provide solvation stabilization for intermediate states along the desired reaction route. It is frequently necessary or desirable to use a blend of solvents to best achieve the various compromises required, with one solvent being an easily-handled good solvent for the base polymer and the other being a good solvent for the nucleophilic reagent and/or providing solvation stabilization for the reaction intermediates. It is most preferred that the chosen solvent system be one that is suitable for both the radical halogenation reaction to introduce the benzylic halogen electrophile into the random isobutylene/para-methylstyrene copolymer, as well as for the nucleophilic substitution reaction to introduce the new pendant functionality, so that a sequential reaction route is feasible without having to recover the halogenated base polymer separately.

Solvents which are particularly suited for this sequential reaction route vary somewhat depending upon composition of the base polymer, but with the elastomeric base Polymers high in isobutylene are the low boiling saturated hydrocarbons ($C_4$–$C_7$) or halogenated hydrocarbons ($C_1$–$C_7$). Often it is desirable to add a more polar cosolvent, such as a low boiling alcohol ($C_1$–$C_7$) during the (second) nucleophilic displacement reaction in order to dissolve and carry-in the nucleophilic reagent, as well as provide solvation stabilization for the nucleophilic displacement reaction. Aromatic solvents such as benzene, toluene, and chlorobenzene are generally good solvents for the base polymer over the entire composition range and provide a reaction medium favorable for many nucleophilic displacement reactions, but often present other problems (i.e. the toxicity of benzene or the high reactivity of toluene during radical halogenation which makes it unsuitable as the reaction medium during this first stage of the sequential reaction route). Preferred solvent composition changes as composition of the base polymer is changed and depends upon whether it is desired to run the reactions in solution or dispersion. In general, solvents of higher solubility parameter containing some aromaticity or halogen are required for solution reactions with the tougher, higher $T_g$ base polymers of this invention which contain higher para-methylstyrene contents.

Similar considerations apply when considering the nucleophilic displacement reaction separately. In order to run this reaction in solution, a good solvent for the base polymer (depending upon its composition) is required and a cosolvent for the nucleophilic reagent may also be desirable or required. Good solvents for the base polymer are similar to those cited above as being suitable for the sequential reaction route, but a broader range of solvents can be considered since inertness during radical halogenation is not required. The low boiling saturated hydrocarbons ($C_4$–$C_7$) or halogenated hydrocarbons ($C_1$–$C_7$) and aromatic hydrocarbons or naphthenes are preferred. Where greater solvent polarity is desired, tetrahydrofuran can be employed or good solvating agents such as dimethyl formamide or dimethyl sulfide can be added. The latter solvents are also good solvents for many of the nucleophilic reagents and may be employed along with alcohols or ketones to dissolve the nucleophilic reagent for addition to the base polymer solution. This technique of adding a solution of the nucleophilic reagent (in a solvent miscible with that used for the base polymer) with rapid stirring to the base polymer solution often results in a fine dispersion of the nucleophilic reagent so that even in cases where the nucleophilic reagent is not completely soluble in the mixed solvent resulting after the addition, an essential solution nucleophilic displacement reaction can still be run because the nucleophilic reagent dissolves during reaction to replenish the solution concentration as the reaction progresses.

In more extreme cases, where the nucleophilic reagent is not soluble in co-solvents miscible with the base polymer solvent, or where the solubility of the nucleophilic reagent in mixed-solvency (which will retain the base polymer in solution) is too low, then a two-phase reaction may be run with the base polymer dissolved in one phase and the nucleophilic reagent in the other. In such cases, good mixing is essential to provide lots of interfacial contact between the reactants, and a phase transfer catalyst is generally desirable to aid in transporting the nucleophilic reagent to the benzylic halogen electrophile site on the base polymer. An example might be highly polar water soluble nucleophilic reagents such as potassium cyanide, sodium sulfite, or nitrilotriacetic acid. Examples of phase transfer catalysts useful in these two phase reactors include (but are not limited to): tetrabutylammonium bromide, tetrabutylammonium bisulfate, tetrabutylammonium hydroxide, benzyl triethylammonium chloride, tetrabutylphosphonium bromide, crown ethers, cyptands, Adogen 464, etc. These same types of materials are sometimes beneficial in speeding up the one-phase solution reaction by providing specific solvation at the reaction site.

The most convenient reaction condition is to run a bulk reaction with the nucleophilic reagent dissolved or dispersed in the base polymer. Working with high solids eliminates the costs of solvent handling and recycle. However, the bulk reaction requires use of an expensive inefficient reactor such as an extruder which is capable of providing mixing in highly viscous systems and restricts the reaction medium so that only selected nucleophilic displacement reactions are possible, and even those are more prone to involve side reactions because of the more restrictive conditions and poorer mixing which prevails during reaction.

In addition to the general reaction considerations already discussed, the factors known to influence nucleophilic substitution reactions (by those skilled in the art) may be applied in making the pendant functionalized polymers of this invention without materially affecting the invention. Thus, reaction routes and activation energy can be controlled by specific solvation, or catalysts, undesired reactions can be prevented by blocking, etc.

EXAMPLES

These examples describe the specific preparations of several derivatives of the benzylic bromide copolymer and their uses in lithographic, corrosion resistant and other coating applications.

Gel refers to the insoluble residue of rubber in the adhesive and is determined by exhaustive solvent extraction of soluble polymer in refluxing toluene for about 72 hours, then drying and weighing the remaining residue.

The coatings were prepared by dissolving the polymers or formulations in toluene and knife coating onto MYLAR or release paper. The coating thicknesses were then dried and irradiated. The coatings thicknesses were typically 1.5 mil. UV irradiation was conducted on an American Ultraviolet Mini-Conveyorized Curing System. UV dosages were determined using the UVA cure radiometer manufactured by EIT. EB crosslinking was performed on an Energy Sciences CB-150 Electrocurtain Electron Beam Accelerator.

Example 1

Preparation of Brominated Base Polymer

A sample isobutylene/para-methylstyrene/para-bromomethylstyrene base terpolymer was prepared as follows:

A 500 ml reaction flask fitted with a thermometer, stirrer, and dropping funnel was set up in a glove box having an oxygen- and moisture-free nitrogen atmosphere, and the flask was cooled to –98° C. by immersion in a controlled temperature liquid nitrogen cooled heat transfer bath. The reactor was charged with 386.6 g purified dry methyl chloride (having a purity of 99.8%), 47.4 g purified, dried and distilled polymerization grade isobutylene (having a purity of 99.9%), and 2.6 g purified, dried and vacuum-distilled para-methylstyrene (2.5 mole % of total monomers). Seventeen ml of a catalyst solution consisting of 0.19 weight percent ethyl aluminum dichloride (EADC) in methyl chloride was allowed to drip slowly into the feed blend from the dropping funnel over the course of 12 minutes while stirring and attempting to maintain temperature by immersion of the reactor in the heat transfer bath. Despite the efforts at cooling, reactor temperature rose from –98° C. to –80° C. due to the exothermic polymerization reaction, and a slurry of polymer in a slightly tannish-colored liquid was formed. Some of the polymer agglomerated on the stirrer and reactor walls. The reactor was quenched by adding 25 ml of cold methanol to yield an agglomerated mass of white polymer in a clear colorless liquid. The polymer was recovered by allowing the methyl chloride to flash off and heading and washing the polymer in methanol; 0.2 weight percent butylated hydroxytoluene (BHT) was added as an antioxidant and the polymer was dried in a vacuum oven at 80° C. Fifty grams of dried white, opaque, tough, rubbery polymer were recovered. Conversion was 100% with a quantitative recovery of the polymer. Catalyst efficiency was about 1550 grams of polymer/gram of EADC. The recovered polymer had a viscosity average molecular weight ($M_v$) of 458,000, and contained 5.2 weight percent (2.5 mole percent) para-methylstyrene. Gel permeation chromatography (GPC) analysis using ultraviolet (UV) and refractive index (RI) detectors showed the para-methylstyrene to be uniformly distributed over the entire molecular weight range indicating that a compositionally homogeneous copolymer had been formed.

The GPC was performed using a Waters 150-C ALC/GPC (Millipore Corporation) with a Waters Lambda-Max Model 481 LC UV Spectrophotometer on line. Data were collected and analyzed using customized software developed with Computer Inquiry Systems, a division of Beckman Inc.

Tetrahydrofuran was used as the mobile phase at various flow rates, but generally 1.0 ml/min. The instruments operated at 30° C. at a wavelength of about 254 nm for the UV. The Polyisobutene backbone has negligible absorbance compared to the aromatic ring at this wavelength. columns used were ∝ Styragel (Waters) or Shadex (Showa Denko). Sets of columns of wide porosity range were calibrated with narrow molecular weight distribution polystyrene standards with molecular weights from $10^3$ to $4\times10^6$. Molecular weights are reported in terms of the polyisobutylene backbone using a universal calibration. The output from the UV and differential refractometer detectors can be compared quantitatively to calculate deviations in composition from the mean. Generally, viscosity average molecular weights are based on separate measurements in diisobutene at 20° C.

The high molecular weight random uniform copolymer of para-methylstyrene and isobutene prepared as above was dissolved in dried normal hexane in a two-liter baffled and jacketed resin flask set up for bromination with a four-neck resin flask top. An air-driven turbine mixer was used to provide efficient mixing, and a thermometer and thermocouple were used to measure and control the temperature, which was adjusted as noted hereinbelow by circulating a controlled temperature heat transfer fluid through the Jacket. One of the necks was used for mounting a dropping funnel containing the bromine solution, which was added dropwise into the reactor. The funnel and reactor were foil-wrapped to exclude light. A nitrogen bubbler tube with a sintered glass frit at the end was mounted in one of the necks, with the frit immersed in the reactor solution to provide nitrogen sparging at a rate which was set and controlled by a rotometer. The fourth neck was connected by plastic tubing to a knock-out trap and caustic scrubber in order to maintain several inches of water positive pressure during reaction, and to absorb and neutralize any HBr and bromine vapors given off during the reaction.

The bromine solution was prepared by adding a weighed amount of bromine to pure mole-sieve dried n-hexane (essentially olefin-free) in the dropping funnel, and mixing to form less than-a 30% solution. The foil-wrapped (to protect from the light) bromine dropping funnel was then mounted on the stirred, temperature-controlled, nitrogen-purged reactor, and a 500 watt tungsten light bulb was mounted immediately next to the reactor. The reactor was heated to 40° C. and the bromine solution added dropwise. The bromine charge was 5 percent by weight of the copolymer, and the reaction occurred rapidly as the bromine was added, as evidenced by rapid HBr evolution and rapid fading of the color of the solution. Bromine was added over the course of two minutes, and the reaction was quenched with excess caustic ten minutes after bromine addition had been initiated. The quenched solution then was washed with water, and the brominated copolymer was recovered by alcohol precipitation and vacuum oven drying as previously described. BHT and tetramethylthiuram disulfide were mixed into the copolymer at 0.1% by weight as stabilizers prior to drying. The recovered brominated copolymer was soluble in diisobutylene, had an $M_v$ of 254,000, and included 1.26 wt. % bromine as measured by Dietert analysis. Analysis using 400 MHz NMR showed the presence of 0.9 mole % benzylic bromide group, with no other brominated structures detectable. GPC analysis using UV and RI detectors showed the brominated copolymer to be a uniform, homogeneous compositional distribution, narrow molecular weight distribution ($M_w/M_n$-2) functional copolymer.

Example 2

Preparation Of Pendant Functionalized Isobutylene/Paramethylstyrene Copolymer Containing Quaternary Ammonium Salt Groups Example 2A In this example, a tough ionically crosslinked quaternary ammonium salt derivative of a random isobutylene/para-methylstyrene/para-bromomethylstyrene base terpolymer was prepared. The base terpolymer was prepared in accordance with the procedure of Example 1. A random isobutylene/para-methylstyrene copolymer containing 2.4 mole percent para-methylstyrene and having a Mooney viscosity of 30 ($M_L$(H8) @ 125° C.) was polymerized in a commercial 1800 gallon butyl polymerization reactor and then radically brominated using VAZO 52 initiation in hexane solution in a 100 gallon glass-lined Pfaudler Br reactor to give a base terpolymer with a Mooney viscosity of 29 containing 2.6 weight percent bromine. The base terpolymer composition was 1.4 mole percent para-bromomethylstyrene (including 0.1 mole percent dibrominated para-methylstyrene) 0.9 mole percent unbrominated para-methylstyrene and 97.7 mole percent isobutylene (there was a small amount of dibromination and slight molecular weight loss due to the relatively high bromination level of 61 percent of para-methylstyrene "mer" units. In the nucleophilic substitution reaction, 450 g of the base terpolymer were dissolved in 2800 g of toluene in a 5 l resin flask under slight nitrogen purge and connected through a reflux condenser to a scrubber and bubbler to produce a 13.85 weight percent polymer solution. Then 47.2 g of triethyl amine dissolved in 700 g of isopropanol were added slowly with stirring to give an 11.4 weight percent solution of base terpolymer in an 80/20 toluene/isopropanol solvent blend with a molar ratio of 3 moles triethanol amine per mole of benzylic bromide. The solution was then heated with stirring to the reflux temperature of about 85°–86° C. under slight nitrogen purge. The solution was stirred and refluxed for 6 hours and then allowed to cool under nitrogen. A trial on a sample aliquot showed that the solution emulsified when shaken with water or water/alcohol (70/30) mixtures so it could not be washed. The emulsions had a pH of 8. The emulsions remained stable when acidified and even when the pH was raised to 10–11 with NaOH solution, the solution would still not separate well. Therefore, the functionalized polymer was recovered by precipitation and kneading in isopropanol and further separated from unreacted triethyl amine by redissolving in a toluene/isopropanol blend and precipitation in isopropanol. The purified functionalized polymer was vacuum oven dried at 70° C. after 0.2 weight percent BHT had been mixed in as an antioxidant. The dried recovered polymer was a spongy, slightly off-white, extremely tough, ionically crosslinked elastomer. The pendant cationic quaternary ammonium salt groups which had become attached to the "base" terpolymer by nucleophilic displacement of the benzylic bromines self-associated to give a tough ionically crosslinked elastomer. It was insoluble in hydrocarbons or alcohols but readily dissolved in a 90/10 toluene/isopropanol mixed solvent which disrupted the ionic crosslinks by solvation. The nucleophilic displacement reaction is shown below:

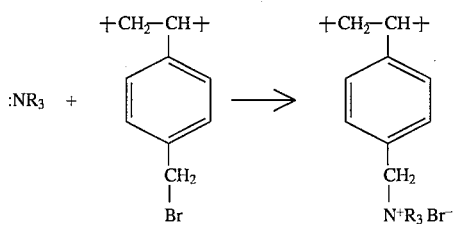

Analysis as summarized below showed that essentially complete substitution of benzylic bromines had occurred to give the pendant quaternary ammonium salt functionalized polymer.

| ANALYSIS | STARTING BASE TERPOLYMER | PENDANT FUNCTIONALIZED COPOLYMER |
|---|---|---|
| $M_v$ | 270,000 | 270,000 |
| Weight percent Br | 2.6 | 2.2 |
| Weight percent N | — | 0.34 |
| NMR | | |
| Mole percent Benzylic Br | 1.4 | — |
| Mole percent quat. | — | 1.4 |
| Mole percent para-methylstyrene | 0.9 | 0.9 |

The proton NMR spectrograph showed the disappearance of the resonances at 4.47 ppm due to the benzylic hydrogens adjacent to the bromine and the appearance of two new resonances: one at 4.7 ppm due to the benzylic hydrogens adjacent to the quaternary nitrogen and another at 3.5 ppm due to the methylene hydrogens adjacent to the quaternary nitrogen. The resonances at 2.3 ppm due to the paramethyl hydrogens of the enchained para-methylstyrene "mer" units remained unchanged by the nucleophilic substitution reaction:

| Proton NMR Resonances For Enchained "Mer" Units | |
|---|---|
| PROTON | RESONANCE (ppm) |
| ⌬—CH₃ ↑ | 2.3 |
| ⌬—CH₂Br ↑ | 4.47 |
| ⌬—CH₂N⁺(CH₂CH₃)₃ Br⁻ ↑(CH₂) | 3.5 |
| ⌬—CH₂N⁺(CH₂CH₃)₃ Br⁻ ↑(N-CH₂) | 4.7 |

A portion of the dried pendant functionalized polymer of this example was dissolved in a 90/10 hexane/isopropanol solvent blend to give a 15 weight percent solution. This solution was cast on a glass plate and the solvent was allowed to evaporate to deposit a tough rubbery film. Drying was completed in a vacuum oven at 70° C. An extremely tough ionically crosslinked film with excellent adhesion to the glass was deposited in this way. The film could be dissolved off again with the mixed hydrocarbon/alcohol solvent blend. In a similar manner, a film of tough ionically crosslinked elastomer was deposited on several porous substrates (i.e. coarse woven fabrics) by impregnating the substrates with the solution by dipping and then allowing the solvent blend to evaporate to produce a proofed fabric coated with a tough ionically crosslinked elastomer. The proofed fabrics were water resistant with water droplets simply beading-up and running off when applied. The elastomers would also be expected to possess the high germicidal properties characteristic of quaternary ammonium salts. This quaternary ammonium salt functionalized polymer would also be useful in many water based adhesives and binder applications where its high strength, toughness, water resistance, germicidal properties, environmental resistance and good aging properties would be beneficial. It would also function well as a corrosion-resistant coating on metals where the water resistance, environmental resistance, good adhesion and corrosion-inhibiting properties of cationic ionomers would be desirable. The ability to self-crosslink through ionic associations without the need to add vulcanization agents (with their attendant problems of extractability, toxicity, cost, etc.) or be subjected to a heated vulcanization step is a highly desirable property of this cationically functionalized polymer.

Example 2B

In this example a pendant functionalized primarily isobutylene-based copolymer containing a cationic quaternary ammonium salt group was prepared and converted to an emulsion-free stable latex. An isobutylene-based polymer with an $M_v$ of 45,000 and containing 2 mole percent para-chloromethylstyrene "mer" units was dissolved in a 70/30 toluene/isopropanol solvent blend to form a 35 weight percent solution by overnight shaking in a 2 gallon container. This solution was charged along with 1.4 times the stiochiometric amount of triethyl amine (based on the amount of benzylic chloride) to a 5 l "ell" resin flask set-up as described in Example 2A and heated to 82° C. with stirring for 4 hours to complete the nucleophilic substitution reaction. Recovery of a sample of the pendant functionalized copolymer for analysis is outlined in Example 2A. Recovery steps include precipitation and kneading in isopropanol, resolution in toluene/isopropanol and reprecipitation in isopropanol before vacuum-oven drying at 70° C. with 0.2 weight percent BHT mixed in as an antioxidant. The purified and dried pendant functionalized copolymer was an extremely tough white crumb ionically crosslinked as shown by its insolubility in toluene but ready solubility in a 90/10 toluene/isopropanol solvent blend. Analysis showed that complete conversion of benzylic chlorines to quaternary ammonium salt groups had occurred. The recovered copolymer contained 0.48 weight percent nitrogen and NMR analysis showed the presence of 2 mole percent benzyl triethyl ammonium chloride salt groups.

The balance of the cooled reaction effluent solution was simply mixed as is with distilled water at a 40/60 water/solution ratio by volume to give a stable oil-in-water emulsion which was refined first with a dispersator and then in a colloid mill to give a very stable fine particle size raw latex. The raw latex was stripped by heating with stirring under nitrogen to remove the solvents and part of the water to give a stable finished latex containing 50 percent solids. No emulsifiers were required in making the latex and the preparation and stripping were accomplished easily without the foaming problems normally experienced in repairing, stripping and concentrating latices containing added soaps as emulsifiers.

Castings from the finished latex dried to clear, hydrophobic, rubbery, tough, ionically crosslinked films as described for the solution cast films of Example 2A. This emulsifier-free cationic latex makes possible the use of this tough, ionically crosslinked cationically functionalized polymer in a host of applications, including dipped goods, binders, nonwovens, coatings, radiation crosslinkable pressure sensitive adhesives, etc., which could benefit from its excellent aging and environmental resistance along with its other unique properties.

Example 3

Preparation Of Pendant Functionalized Isobutylene/Substitutued Para-methylstyrene Copolymer Containing Quaternary Phosphonium Salt Groups In this example, a pendant functionalized primarily isobutylene-based copolymer containing cationic quaternary phosphonium salt groups was prepared and converted to a stable, emulsifier-free latex. An isobutylene-based polymer with an $M_v$ of 17,000 and containing 1.9 mole percent para-chloromethylstyrene "mer" units was dissolved in a dried 75/25 heptane/isopropyl alcohol solvent blend under nitrogen to form a 40 weight percent polymer solution in a 5 l "ell" resin flask. The reactor was connected through a dry ice-cooled cold finger (setup to reflux condensables back into the flask) to a scrubber for vented gasses and bubbler to maintain several inches of water positive pressure on the reactor. A slow dry nitrogen flow was maintained through the system to maintain the reactants under a dry, inert atmosphere. With stirring at 25° C. and while maintaining the dry nitrogen seal, twice the stoichiometric amount of triethyl phosphine (on benzylic chloride) as a 67 weight percent solution in isopropanol was added dropwise from a sealed dropping funnel. The mixture was heated with stirring to the reflux temperature of 77° C. and refluxed for 2 hours under nitrogen and constent stirring before being cooled. A sample of the pendant functionalized polymer was recovered from the resulting clear effluent solution for analysis. The recovery process comprised the steps of precipitation and kneading in isopropanol, resolution in hexane/isopropanol solution, and reprecipitation from isopropanol followed by vacuum-oven drying at 70° C. with 0.2 percent BHT mixed in as an antioxidant. Despite the very low molecular weight, the recovered polymer was a tough elastomeric ionically crosslinked polymer very unlike the soft, sticky, semi-fluid starting base terpolymer. Analysis showed it contained 0.95 mole percent phosphorus indicating about 50 percent conversion of benzylic chlorines to quaternary phosphonium salt groups had occurred.

The remaining cooled solution from the nucleophilic substitution reaction was simply mixed as is with distilled water a 40/60 water/solution ratio by volume to give a stable oil-in-water emulsion which was refined and then stripped and concentrated as in Example 2B to give a stable, emulsifier-free, fine particle size, cationic, latex at 50% solids by weight. As in Example 2B, the latex preparation and stripping was accomplished easily without foaming problems, and castings from the latex dried to hydrophobic, clear, tough, ionically crosslinked, elastomeric films which would be useful in a broad spectrum of applications as already outlined. The pendant functionalized polymer of this latex contained mixed functionalities, including benzylic chlorines and quaternary phosphonium chloride salt groups because the nucleophilic substitution reaction had not gone to completion. Nevertheless, the presence of 1 percent by mole quaternary phosphonium chloride salt groups was adequate to permit preparation of the stable emulsifier-free latex, and was adequate to provide ionic crosslinking in deposited polymer films. The presence of the benzylic chloride would permit permanent covalent cross link to be formed in many ways or permit other reactions to be run on this useful pendant functionalized polymer.

The nucleophilic substitution reaction is shown below:

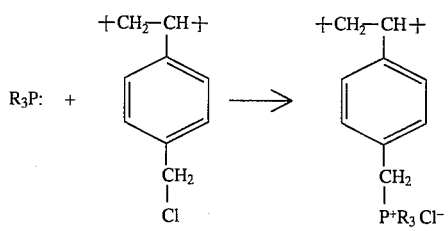

Analysis showed that the reaction was accomplished without degradation or crosslinking and under the conditions of this experiment achieved a 50 percent conversion of benzylic chlorines to quaternary phosphonium chloride salt groups. Higher conversions could be achieved with longer reaction times and/or higher reaction temperature or by choosing a more favorable reaction medium.

Examples 2 and 3 all show that the backbone saturated pendant functionalized copolymers of this invention containing various cationic pendant functionality are readily prepared by following the procedures of this invention and that they have useful combinations of properties for various applications. The pendant cationic groups are capable of imparting self-emulsification properties to make possible the facile preparation of emulsifier-free cationic latices and the pendant cationic groups self-associate in dry deposited films to provide ionic crosslinks which are reversible by proper solvation.

Two classes of cationic pendant functionalized copolymers have been exemplified (i.e. quaternary ammonium salts and quaternary phosphonium salts), but others such as the sulfonium salts, for example, using thioethers as the nucleophile as shown below are also possible:

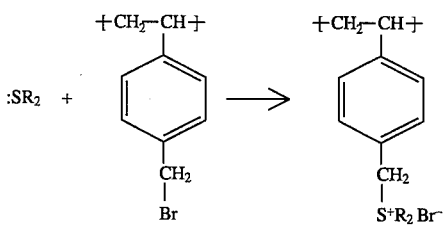

Properties of these cationic pendant functionalized polymers can be varied and controlled by the type of cationic group attached as well as by the R groups present and the counterion so that a broad range of properties is possible. Thus, while we have exemplified only the triethyl quaternary ammonium and phosphonium salts, the quaternary salts with other R groups are readily prepared to impart modified properties. Generally as the R groups become smaller (i.e. from ethyl to methyl), the ionic associations become stronger and more difficult to disrupt, but hydrophobicity improves as the R groups become larger. Properties are also strongly influenced by the counterion (i.e. chloride, bromide, bisulfate, etc.). Similarly properties of the S-isothiouronium salts are strongly dependent upon whether thiourea itself is used (as used in our examples) or substituted thioureas are used as the nucleophile. Strength of the ionic crosslinks and hydrogen bonding properties are both diminished as substituted thioureas containing more and longer R groups are used to prepare the salts. Also the R groups themselves can contain other functionality to prepare cationic salts containing other useful functionality as for example, using instead triethanol amine as the nucleophile to prepare a pendant functionalized polymer containing quaternary ammonium salt groups with hydroxy functionality to permit further reactions or promote adhesion or dispersant action, etc.:

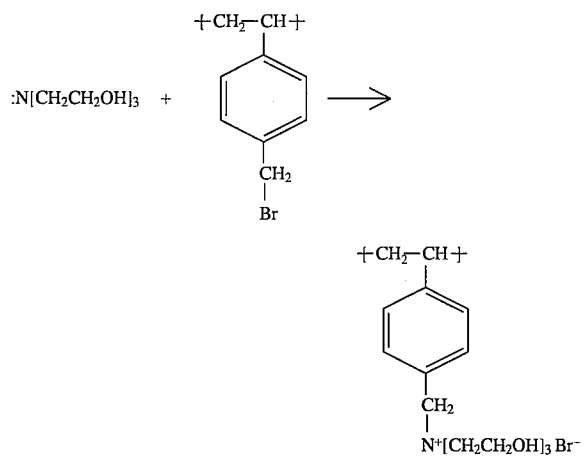

In addition, although not exemplified herein, it would be obvious to one skilled in the art that pendant anionic groups could also be attached to prepare anionic pendant functionalized polymers such as carboxylates or sulfonates.

Example 4

Preparation Of Pendant Functionalized Isobutylene/Para-methylstyrene Copolymer Containing Dithiocarbamate Ester Functionality Example 4A In this example, pendant dithiocarbamate ester functionality was attached to a random isobutylene/para-methylstyrene/para-bromomethylstyrene base terpolymer by nucleophilic substitution using sodium diethyl dithiocarbamate as the nucleophilic reagent. The base terpolymer containing the reactive electrophilic benzylic bromines was prepared as already outlined. The starting polymer was prepared as in Example 1; it contained 3.3 mole percent para-methylstyrene with a viscosity average molecular weight of 68,000. The polymer was radically brominated using light initiation at 40° C. as a 15 percent solution in hexane to give a base terpolymer with a viscosity average molecular weight of 65,000 and containing 4.3 weight percent bromine. The base terpolymer composition was 96.7 mole percent isobutylene, 2.6 mole percent para-bromomethylstyrene, and 0.7 mole percent para-methylstyrene. There was some dibrominated para-methylstyrene present because of the high bromination level achieved. In the nucleophilic substitution reaction, 200 g of the base terpolymer was dissolved in 2100 g of toluene in a 5 l resin flask under nitrogen to form an 8.7 weight percent solution. Then 22 g of sodium diethyl dithiocarbamate dissolved in 700 g of isopropyl alcohol was added slowly with stirring at room temperature to give a 6.6 weight percent polymer solution in a 75/25 toluene/isopropanol solvent blend with 1.2 moles per mole of Br of the nucleophilic reagent. The solution was heated with stirring under $N_2$ at 80° C. for 6 hours to complete the nucleophilic substitution reaction before being cooled. However, samples removed after 1 and 3 hours showed that the reaction was already over after 1 hour at 80° C. The cooled solution was given several water washes to remove the sodium bromide byproduct and other water solubles and then the polymer was recovered by precipitation and kneading in isopropanol as in the earlier examples. The polymer was dried in a vacuum oven at 70° C. without added stabilizers since the attached dithiocarbamate ester groups themselves acted as a polymer bound stabilizer. The recovered polymer was a tough slightly tannish elastomer with complete solubility in hexane. Analysis as summarized below showed a very high conversion of benzylic bromine to dithiocarbamate ester had been achieved.

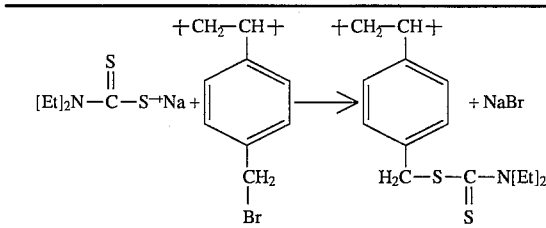

ANALYSIS

| | BASE TERPOLYMER | PENDANT FUNCTIONALIZED COPOLYMER |
|---|---|---|
| $M_v$ | 65,000 | 65,000 |
| Weight percent Br | 4.3 | 0.6 |
| Weight percent Sulfur | — | 2.97 |
| Weight percent N | — | 0.65 |
| NMR | | |
| Mole percent benzylic Br | 2.6 | — |
| Mole percent dithiocarbamate ester | — | 2.6 |

The proton NMR spectrograph confirmed the chemical analysis in showing the quantitative conversion of benzylic bromine functionality to pendant dithiocarbamate ester functionality.

| Proton NMR Resonances for Enchained Pendant Functional Dithiocarbamate Ester "Mer" Unit | |
|---|---|
| PROTON | RESPONSE (ppm) |
| 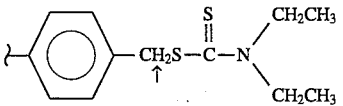 | 4.48 |
| 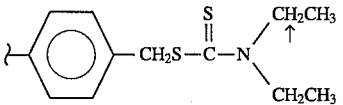 | 4.08 |

| Proton NMR Resonances for Enchained Pendant Functional Dithiocarbamate Ester "Mer" Unit | |
|---|---|
| PROTON | RESPONSE (ppm) |
|  | 3.7 |

This experiment showed that facile conversion of benzylic bromine functionality in the base terpolymer to pendant dithiocarbamate ester functionality was possible via nucleophilic displacement. The attached dithiocarbamate ester functionality provides built-in antioxidant protection to the polymer as well as vulcanization and covulcanization activity and permits free radical chemistry to be employed as is discussed more later.

Example 4B

In this example a base isobutylene/para-methylstyrene/para-bromomethylstyrene terpolymer was prepared and converted via a sequential reaction route to a copolymer containing pendant dithiocarbamate ester functionality without separate isolation and recovery of the intermediate base terpolymer. This sequential reaction route which avoids recovery of the intermediate base terpolymer is of course economically advantageous.

An isobutylene/para-methylstyrene random copolymer containing 2.4 mole percent para-methylstyrene with a Mooney viscosity of 30 (the same copolymer used in Example 2A) was dissolved in hexane under nitrogen to form a 17 weight percent solution with 8 percent by weight of ATOMITE $CaCO_3$ stirred in suspension as an acid scavenger to give an opaque white slightly viscous solution which was heated with stirring under nitrogen to 60° C. The solution was illuminated with a 120 Watt spotlight and then with continued stirring at 60° C. with slight nitrogen purge, 6.5 weight percent bromine on polymer was added as a 20 weight percent solution in hexane. The solution tuned bright orange/red as the bromine was added but the color rapidly faded as the radical bromination reaction took place. Despite the opacity of the solution, the light-initiated bromination progressed rap idly so that the bromine color had completely faded and the light was turned off within 5 minutes. A sample of the brominated solution was removed to enable characterization of the brominated base terpolymer and then 1 mole of sodium diethyl dithiocarbamate per mole of bromine was added as a 5 weight percent solution in isopropanol to give an 80/20 hexane/isopropanol solvent blend and the solution was stirred hot at 60° C. to effect the nucleophilic substitution reaction. Samples removed at 15 minute intervals to follow the progress of the reaction showed that it was complete within ½ hour. The samples and final solutions were given several water washes with dilute HCl (1%) to convert excess $CaCO_3$ to $CaCl_2$ and remove it and other water solubles into the aqueous wash. The solution was then washed several additional times with water to remove traces of acid before the polymer was recovered by precipitation and kneading in isopropanol as described in the previous examples.

In the first step of this sequential reaction, a portion of the enchained para-methylstyrene moieties of the starting copolymer were converted to para-bromomethylstyrene moieties by light initiated radical bromination with the byproduct HBr being removed by reaction with the dispersed calcium carbonate:

$$Br_2 \longrightarrow 2\,Br\bullet$$

INITIATION

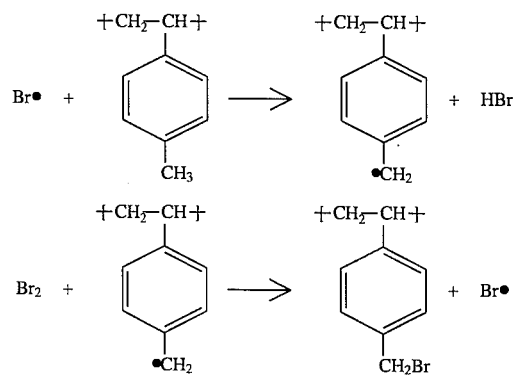

RADICAL CHAIN
BROMINATION STEP $$2HBr + CaCO_3 \longrightarrow CaBr_2 + H_2CO_3$$

ACID
SCAVENGING

In the second step of the sequential reaction, the sodium diethyl dithiocarbamate nucleophilic reagent reacted with the electrophilic benzylic bromines to produce the desired pendant functionalized product:

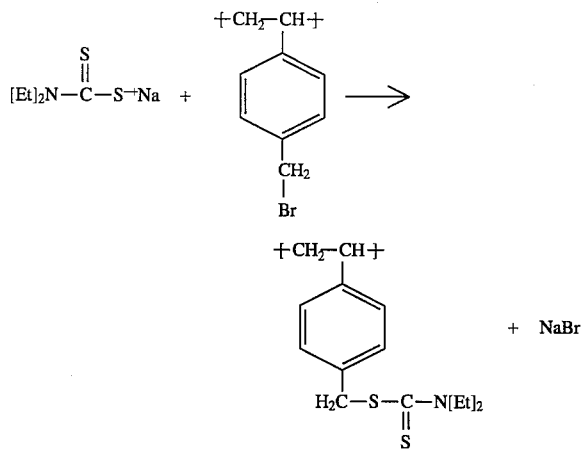

Analysis as summarized below showed that the intermediate base terpolymer contained 1.2 mole percent benzylic bromine functionality whereas the final pendant functionalized product contained 0.9 mole percent dithiocarbamate ester pendant functionality with 0.3 mole percent benzylic bromine functionality remaining.

| ANALYSIS | | | |
|---|---|---|---|
| | STARTING COPOLYMER | INTERMEDIATE BASE TERPOLYMER | PENDANT FUNCTIONALIZED COPOLYMER |
| $M_v$ | 280,000 | 280,000 | 280,000 |
| Weight percent Br | — | 2.0 | 0.5 |
| Weight percent S | — | — | 1.0 |
| Weight percent N | — | — | 0.2 |
| NMR | | | |
| Mole percent PMS | 2.3 | 1.1 | 1.1 |
| Mole percent Br PMS | — | 1.2 | 0.3 |
| Mole percent dithiocarbamate | — | — | 0.9 |

This mixed functionality polymer was stable without any added antioxidants and was vulcanizable with promoted zinc oxide and/or conventional sulfur vulcanization systems. It also showed good covulcanization in blends with natural rubber. Films of this copolymer crosslinked on exposure to UV-radiation as opposed to the degradation normally experienced with high isobutylene containing polymers exposed to UV-radiation. The crosslinking under irradiation is attributed to the ready ability of the dithiocarbamate ester functionality to form stable radicals under irradiation to permit radical crosslinking and other radical chemistry reactions to occur rather than backbone cleavage as normally occurs with isobutylene based polymers:

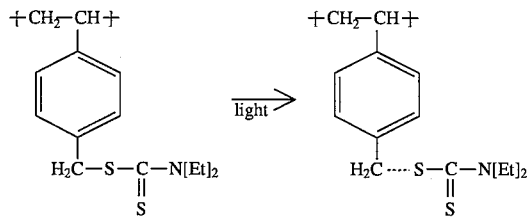

crosslinks by coupling insertion reactions etc.

This ability of the dithiocarbamate ester functionality to prevent UV degradation and/or to impart controlled crosslinking under free radical conditions is very valuable in exterior applications such as tooling, coating, white tire sidewalls, etc., where the tendency of isobutylene base copolymers to degrade and develop surface tackiness has always impaired their utility in such areas.

Example 4C

In this example a pendant functionalized isobutylene based copolymer containing nearly equal amounts of dithiocarbamate ester and benzylic bromine functionality was prepared via a sequential reaction route without recovery of the intermediate base terpolymer.

Five hundred grams of an isobutylene/para-methylstyrene random copolymer containing 4.5 mole percent para-methylstyrene with a Mooney viscosity of 34 was dissolved in 2833 g of n-hexane under nitrogen a 5 l resin flask to yield a 15 weight percent solution. Forty-five grams of OMYACORB UFT calcium carbonate was stirred in as an acid scavenger to yield an opaque white dispersion and then the solution was heated with stirring to 60° C. and illuminated with a 120 Watt spotlight. Thirty-five grams of bromine (7 weight percent on polymer) was added as a 25 weight percent solution in hexane to effect radical bromination and produce the base terpolymer. The bromination reaction was over in <5 minutes and after removal of a sample for characterization of the base terpolymer, 30 g of sodium diethyl dithiocarbamate (0.9) moles/mole of bromine) dissolved in 600 g of isopropanol (to give an 83/17 hexane/isopropanol solvent blend) was added to effect the nucleophilic substitution reaction. The solution was stirred hot at 60° C. for ½ hour to complete the reaction. After the solution was cooled and acid washed, the polymer was recovered by alcohol precipitation as in Example 4B. The sequential reactions proceeded as already outlined. Analysis as summarized below showed on intermediate base terpolymer with 2.2 weight percent bromine and a final pendant mixed functionalized product with 0.7 mole percent benzylic bromine and 0.7 mole percent dithiocarbamate ester functionality.

| ANALYSIS | | | |
|---|---|---|---|
| | STARTING COPOLYMER | INTERMEDIATE BASE TERPOLYMER | FINAL MIXED PENDANT FUNCTIONALIZED PRODUCT |
| Mooney | 34 | 33.5 | 33 |
| Weight percent Br | — | 2.2 | 1.05 |
| Weight percent S | — | — | 0.77 |
| Weight percent N | — | — | 0.17 |
| NMR | | | |
| Mole percent PMS | 4.5 | 3.1 | 3.1 |
| Mole percent Br PMS | — | 1.4 | 0.7 |
| Mole percent Dithiocarbamate Ester | — | — | 0.7 |

These examples show that pendant dithiocarbamate ester functionality is readily introduced into the base terpolymer of this invention by a nucleophilic substitution reaction. Stable mixed functionality polymers containing both benzylic bromine and dithiocarbamate ester functionality can be made at any desired ratio of the functionalities and an economical sequential reaction route can be utilized.

Example 5

Preparation Of Pendant Functionalized Isobutylene/Para-methylstyrene Copolymer Containing Various Ester Functionalities Example 5A In this example, pendant cinnamate ester functionality was attached to a random isobutylene/para-methylstyrene/para-bromomethylstyrene base terpolymer by nucleophilic substitution using a cinnamic acid salt as the nucleophilic reagent. The base terpolymer used in this example was identical to that used in Examples 4A and 4B and contained 0.9 mole percent brominated para-methylstyrene, 1.4 mole percent para-methylstyrene, and 97.7 mole percent isobutylene with a $M_v$ of 135,000.

In the nucleophilic substitution reaction, 750 g of the base terpolymer was dissolved in 3000 g of toluene in a 5 l resin flask with an attached air condenser by stirring under $N_2$ to form a 20 weight percent solution. Next, 35.4 g of cinnamic acid (1.5 moles/mole bromine), 7.3 g of 40 weight percent tetrabutyl ammonium hydroxide solution in methanol (0.5 mole/mole acid) and 9.6 g of 50 weight percent sodium hydroxide solution in water (0.5 mole/mole acid) were stirred in and the resulting emulsion was heated to a reflux temperature of 86° C. under constant stirring. The solution was refluxed for 3 hours at 86° C. to complete the reaction with samples removed at the initial reflux point and after ½ and 1½ hours of refluxing to monitor the progress of the reaction. The solution gradually became clearer during the reaction. After three hours it was a translucent, light beige color. The final solution and samples were given acidic, basic and neutral washes. Then the polymer was recovered by precipitation and kneading in isopropanol as in earlier examples and vacuum oven dried at 70° C. with a 0.2 weight percent BHT mixed in as an antioxidant. Analysis was conducted using a Princeton-Gamma Tech Bromine analyzer and is summarized below for bromine remaining in the starting polymer against reaction extent shows that the nucleophilic substitution reaction was proceeding slowly and had still not gone to completion after three hours of refluxing:

| Reaction Progression | Wt. % Bromine |
| --- | --- |
| Starting base terpolymer | 1.60 |
| At point of reflux | 1.37 |
| ½ hour later | 1.08 |
| 1-½ hours later | 0.91 |
| (final) 3 hours later | 0.54 |

The final product following three hours of reflux contained 0.8 mole percent cinnamate ester and 0.1 mole percent benzylic bromine, The nucleophilic substitution reaction was about 90 percent complete:

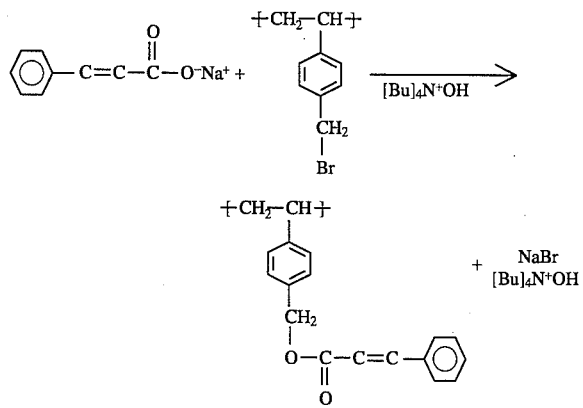

Proton NMR spectoscopy was used to quantify the amount of cinnamate ester functionality introduced:

NMR Resonance

| PROTON | RESONANCE (ppm) |
| --- | --- |
| ⌬—CH$_2$O—C(=O)—CH=CH—⌬ (↑ on CH$_2$) | 5.2 |
| ⌬—CH$_2$O—C(=O)—CH=CH—⌬ (↑ on first CH) | 6.48 |
| ⌬—CH$_2$O—C(=O)—CH=CH—⌬ (↑ on second CH) | 7.73 | with, of course, the new aromatic protons also being present in the spectrograph.

This experiment showed that pendant carboxylic acid ester functionality can be introduced into the base terpolymer of this invention by nucleophilic substitution under suitable conditions. The cinnamate ester functionality enables crosslinking to occur when the polymer is irradiated by actinic radiation.

Example 5B

In this example, pendant fatty acid ester functionality was attached to a random isobutylene/para-methylstyrene/para-bromomethylstyrene base terpolymer by nucleophilic substitution using a commercial $C_{18}$ fatty acid in linolenic acid (INDUSTRENE 120 from Witco Corporation) as the fatty acid. The base terpolymer used had a Mooney viscosity of 30 and contained 2 mole percent para-bromomethylstyrene, 5 mole percent para-methylstyrene, and 93 mole percent isobutylene.

In the nucleophilic substitution reaction, 500 g of the base terpolymer was dissolved in 2833 g of toluene in a 5 l resin flask with an attached air condenser under nitrogen pad to form a 15 weight percent solution. Then 63.3 g of INDUSTREEN 120 Linseed fatty acid (1.2 moles/mole Br) was added along with 72.8 g of 40 weight percent tetrabutyl ammonium hydroxide solution in methanol (0.5 moles/mole acid) and 9 g 50 percent NaOH solution in water (0.5 moles/mole acid). The emulsion that formed was opaque and slightly yellowish. Next, it was heated to the reflux temperature at 87° C. under nitrogen with stirring. The emulsion was refluxed for 2 hours with samples being removed at the reflux point, after ½ hour and after 1 hour of refluxing to monitor the progress of the reaction. During the reaction, the reaction solution became clearer with water droplets being distilled over into the condenser. The final solution was translucent with a light yellow color. The reaction samples and final reaction effluent were given acidic, basic, and then neutral water washes before the polymer was precipitated in isopropanol and vacuum oven dried as before. Analysis below, as in Example 5A, for bromine remaining in the starting polymer indicates that the nucleophilic substitution with the $C_{18}$ fatty acid was faster than with the cinnamic acid salt and was essentially complete in one hour. Apparently the carboxylate nucleophile attached to the $C_{17}$ hydrocarbon more easily achieved necessary intimate contact with the benzylic bromine electrophile attached to the base terpolymer than the carboxylate group attached to a shorter aryl group.

| Reaction Progression | Wt. % Bromine |
|---|---|
| Starting Base Terpolymer | 3.0 |
| At Reflux | 1.06 |
| ½ Hour Later | 0.45 |
| 1-½ Hours Later | 0.29 |
| (Final) 3 Hours Later | 0.23 |

NMR analysis showed that the final product contained 2 mole percent ester and essentially no benzylic bromine indicating that the nucleophilic substitution reaction had gone to completion. (Small residual bromine content measured by the bromine analyzer probably represented inorganic bromides not thoroughly washed out during recovery steps). The NMR spectrum (below) shows a resonance due to the benzylic ester protons at 5.08 ppm and a broad complicated resonance due to the olefinic protons in the $C_{18}$ chain at 5.3–5.5 ppm.

NMR Resonance

| PROTON | RESONANCE (ppm) |
|---|---|
| 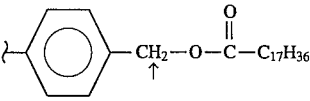 | 5.08 |
| 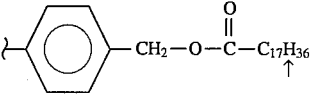 | 5.35–5.55 |

In comparison, the benzylic ester protons of the cinnamate ester of Example 5A showed a higher field resonance at 5.2 ppm due to the conjugation present in the cinnamate ester.

The fully converted linseed oil acid ester derivative of this example remained completely soluble and showed no evidence of vulcanization crosslinking when compounded and heated under typical vulcanization conditions with zinc oxide or promoted-zinc oxide vulcanization systems which are effective with the starting. brominated "base" terpolymer and another confirmation of the absence of any remaining benzylic bromines. The functionalized polymer, however, gave good vulcanizates when compounded and cured with typical sulfur vulcanization system below:

Polymer-100
Sulfur-1.25
M. Tudds-1.50
Altax-1.00
Zinc Oxide-3.00

The presence of unsaturation in the pendant fatty acid side chains thus permits conventional sulfur vulcanization systems to be employed to vulcanize the functionalized ester derivative of this example. The pendant unsaturation is also useful in permitting covulcanization with the high unsaturation general purpose rubbers such as natural rubber or SBR. Testing of sulfur vulcanized specimens of this ester derivative in a standard ozone resistance test showed that they retained the outstanding ozone resistance characteristic of the saturated base terpolymer vulcanizates. The pendant unsaturation in the side chain thus imparts conventional sulfur vulcanization activity without adversely affecting ozone resistance.

Example 6

In this example, pendant fatty acid ester functionality in which the fatty acid contained conjugated unsaturation was attached to the base terpolymer. The fatty acid used was derived from Tung oil and was high in eleostearic acid. The base terpolymer had a Mooney viscosity of 32 and contained 3.6 weight percent bromine, 2.2 mole percent para-bromomethylstyrene, 2.7 mole percent para-methylstyrene, and 95.1 mole percent isobutylene. In the nucleophilic substitution reaction, 666 g of a "wet" base terpolymer crumb (500 g dry weight) were dissolved in 283 g toluene in a 5 l resin flask with an attached air condenser to yield a 15 weight percent polymer solution containing dispersed water. This use of the "wet" crumb in the nucleophilic substitution reaction was advantageous as it avoided the need to finish the brominated "base" terpolymer prior to convening it to the pendant functionalized polymer. To the polymer solution was added 76 g of Tung oil acid (~1.2 moles/mole bromine), 87.4 g of 40 weight percent tetrabutyl ammonium hydroxide solution in methanol (0.5 moles/mole acid) and 43 g of 50 weight percent sodium hydroxide solution in water (0.2 moles/mole acid) to give a milky white emulsion which was heated to a reflux temperature of about 84° C. The reaction mixture was allowed to reflux for one hour under constant stirring before being cooled, washed and recovered as previously outlined. Samples removed at the reflux point and ½ hour later were similarly recovered.

The substitution reaction was proceeding rapidly under these conditions as shown by the following bromine analysis:

| Reaction Progression | Wt. % Bromine |
|---|---|
| Starting Base Terpolymer | 3.6 |
| At the Reflux Point | 0.78 |
| ½ Hour Later | 0.56 |
| (Final) 3 Hours Later | 0.40 |

The NMR spectrum shows a resonance due to the benzylic ester protons at 5.08 ppm, some residual resonance at 4.47 ppm due to remaining benzylic bromide, and a series of resonances at 5.3–6.4 ppm due to the olefinic protons of the $C_{18}$ acid (with the conjugated unsaturation resonances being the high field resonances at >5.9 ppm). The final product contained 1.9 mole percent ester with 0.2 mole percent benzylic bromide remaining. It was completely soluble in toluene with a Mooney viscosity of 31 which was the same as the starting base terpolymer.

Despite the highly active nature of the pendant conjugated unsaturation, this functionalized polymer showed good stability with no tendency to crosslink during drying or storage. However, the attached conjugated unsaturation permitted facile vulcanization and covulcanization with unsaturated rubbers using sulfur vulcanization systems. The conjugated unsaturation also provided good crosslinking under electron beam irradiation and oxidative surface curing upon outdoor exposure to sunlight. This is a highly desirable property in exterior coatings such as roof coatings. The conjugated unsaturation is also very active in radical reactions thus permitting grafting reactions with free radical polymerizable monomers. This highly active Tung oil acid ester derivative is useful in a wide range of applications.

It is obvious that nucleophilic substitution reactions with various carboxylic acids could be used to attach many other functional side chains such as hydroxy using ricinoleic acid, etc.

Example 7

Starting with a base isobutylene/para-methylstyrene/para-bromomethylstyrene terpolymer intermediate similarly prepared to Example 1, the UV photoinitiator benzophenone was incorporated into the terpolymer as a 4-benzoylbenzoate ester derivative.

A 250 ml glass reaction vessel, fitted with a mechanical stirrer, a hose connector, and a septum purged with nitrogen, operating in an atmosphere of nitrogen, was charged with 10 g base terpolymer (Mooney viscosity—32, 1.88 weight percent bromine), dissolved in 80 ml toluene. In a second flask, a toluene solution of tetrabutylammonium and 4-benzoylbenzoate was prepared under nitrogen by dissolving 0.51 g 4-benzoylbenzoic acid and tetrabutyl ammonium hydroxide (2.2 ml, 1M in methanol) in 25 ml toluene, then reducing this solution by one-half its volume. Next, an additional 0.09 g 4-benzoylbenzoic acid was dissolved in 25 ml toluene and added dropwise until the second solution was weakly basic. This solution was then added to the first. The temperature of the mixture was raised to 70° C. and allowed to react for 6 hours. Upon completion, the polymer was precipitated from methanol and dried in a vacuum oven at 1 mm Hg, 40° C. Analysis for 4-benzoylbenzoate content (NMR, IR) showed complete conversion of the 4-bromomethylstyrene to the 4-benzoylbenzoate ester. The functionalized polymer had Mooney viscosity of 32 and comprised 0.75 mole percent 4-benzoylbenzoate ester. Films (1.5 mil) were drawn onto release paper then exposed to UV radiation. The functionalized polymer showed good crosslink response at low absorbance levels as seen in Table I.

Examples 8–11

In the following examples, 3-benzoylbenzoate (Example 8), 2-benzoylbenzoate (Example 9), 4-hydroxybenzophenone (Example 10), and anthraquinone-2-carboxylate (Example 11) derivative functionalized copolymers were prepared in nucleophilic substitution reactions according to the procedure in Example 7 to incorporate the photoinitiators benzophenone, hydroxybenzophenone or anthraquinone. The base isobutylene/para-methylstyrene/para-bromomethylstyrene terpolymer was the same throughout, similarly prepared to the procedure in Example 1, and having a Mooney viscosity of 32 and 1.88 weight percent bromine. The UV-functionalized copolymers comprised 0.75 mole percent ester. In each reaction, 2.0 g base terpolymer was utilized. The initial quantity of 3-benzoylbenzoic acid reactant was 0.11 g followed by an additional 0.02 g to neutralize litmus paper. The quantity of 2-benzoylbenzoic acid utilized was the same as for 3-benzoylbenzoic acid. The quantity of anthraquinone-2-carboxylic acid utilized was 0.12 g and the quantity of 4-hydroxybenzophenone was 0.09 g.

Films (1.5 mil) were drawn onto release paper for gelation studies. The data in Table I show outstanding crosslink conversion at low UV absorbance levels for the photoinitiator-grafted polymers for these examples also.

TABLE I

| EXAMPLE | TYPE FUNCTIONALITY | PERCENT GEL FORMATION[1] LEVEL OF UV EXPOSURE (J/CM$^2$) | | |
|---|---|---|---|---|
| | | 0.1 | 0.2 | 0.4 |
| 7 | 4-benzoylbenzoate | 94 | 95 | 95 |
| 8 | 3-benzoylbenzoate | 90 | 89 | 89 |
| 9 | 2-benzoylbenzoate | 68 | 82 | 79 |
| 11 | anthraquinone-2-carboxylate | 83 | 85 | 88 |

[1] Percent insoluble materials after toulene extraction

Examples 12–19

To the cinnamate functionalized copolymers similarly produced in Example 5A, tests were performed to determine the level of gel formation at variable coating thickness and UV-exposure. The base terpolymer had a $M_v$ of about 135,000 and was made up of 2.3 mole percent para-methylstyrene including 0.9 mole percent brominated para-methylstyrene. It was convened via bromination and subsequent nucleophilic displacement into the polymer of Example 5A which contained 0.1 mole percent para-bromomethylstyrene and 0.8 mole percent cinnamate ester. The cinnamate functionalized copolymer was crosslinked via a UV initiated 2+2 photocycloaddition with the results appearing in Table II.

From the data it can be seen that the highest degree of crosslinking occurred in thin coatings with high UV exposure and low weight percent functionalization.

TABLE II

| EXAMPLE | MOLE PERCENT CINNIMATE | LEVEL OF UV EXPOSURE (J/cm$^2$) | COATING THICKNESS (mil) | GELATION (% OF POLYMER) |
|---|---|---|---|---|
| 12 | 0.8 | 0.3 | 0.09 | 44 |
| 13 | 0.8 | 0.3 | 0.17 | 51 |
| 14 | 0.8 | 0.3 | 0.25 | 34 |
| 15 | 0.8 | 0.3 | 0.42 | 19 |
| 16 | 0.8 | 0.6 | 0.14 | 69 |
| 17 | 0.8 | 0.6 | 0.17 | 73 |
| 18 | 0.8 | 0.6 | 0.37 | 64 |
| 19 | 0.8 | 0.6 | 0.57 | 36 |

Examples 20–21

In the following examples, the 4-hydroxybenzophenone functionalized copolymer from Example 10 was utilized as corrosion barrier coatings on galvanized steel plates. Initially, the Example 10 polymer was dissolved in toluene then coated onto 2 galvanized steel plates. Evaporation of the solvent provided a I rail thick film coating. One plate was crosslinked by exposure to 0.24 J/cm$^2$ UV-radiation and the other was not crosslinked. After 10 days immersion in a 5 percent NaCl salt bath, the plates were observed for corrosion resistance. Both coatings protected the galvanized steel plates from corrosion, but the plate with uncrosslinked film showed corrosion intrusion under the outer edges of the coating. The advantages of crosslinking the coating are improved resistance to corrosion and non-polar solvents. Potential applications for such material include corrosion protection in the automotive industry.

Example 22

In the following example, the 4-hydroxybenzophenone functionalized copolymer from Example 10 was utilized as a coating in a lithographic application. A 1 mil film was coated onto a cardboard substrate as described in Examples 20–21. The dried film was irradiated with 0.25 $J/cm^2$ UV light through a photographic negative to produce a stenciled image in the coating. The image was revealed by developing in toluene to remove the uncrosslinked polymer.

The foregoing description of the invention is illustrative and various modifications will become apparent to those skilled in the art in view thereof. It is intended that all such variations which fall within the scope and spirit of the appended claims be embraced thereby.

What is claimed is:

1. An article having printing elements made by:

(a) coating at least a portion of a surface of an article with a composition comprising a random copolymer of an isoolefin of 4 to 7 carbon atoms and para-alkylstyrene comonomer, said isoolefin comprising 10 to 99.5 weight % of said copolymer and said para-alkylstyrene comprises 0.5 to 90 weight % of said copolymer, wherein about 0.5 to 55 weight % of said copolymer comprises para-alkylstyrene monomers having a photoinitiator substituted on the pendent alkyl group, said copolymer having a substantially homogenous compositional distribution;

(b) selectively exposing said surface to gamma, UV, electron beam, visible, or microwave radiation to crosslink the copolymer in the area exposed to said radiation; and (c) removing the uncrosslinked copolymer to develop a pattern of the crosslinked copolymer.

* * * * *